(12) United States Patent
Dietrich et al.

(10) Patent No.: US 12,189,301 B2
(45) Date of Patent: Jan. 7, 2025

(54) METHOD FOR PRODUCING AN OPTICAL SYSTEM AND OPTICAL SYSTEM

(71) Applicant: Karlsruhe Institute of Technology, Karlsruhe (DE)

(72) Inventors: Philipp-Immanuel Dietrich, Igersheim (DE); Christian Koos, Siegelsbach (DE); Matthias Blaicher, Ettlingen (DE); Ingo Reuter, Karlsruhe (DE); Yilin Xu, Karlsbad (DE)

(73) Assignee: Karlsruhe Institute of Technology, Karlsruhe (DE)

( * ) Notice: Subject to any disclaimer, the term of this patent is extended or adjusted under 35 U.S.C. 154(b) by 656 days.

(21) Appl. No.: 17/487,582

(22) Filed: Sep. 28, 2021

(65) Prior Publication Data

US 2022/0011677 A1 Jan. 13, 2022

Related U.S. Application Data

(60) Division of application No. 16/399,492, filed on Apr. 30, 2019, now Pat. No. 11,169,446, which is a
(Continued)

(30) Foreign Application Priority Data

Nov. 2, 2016 (DE) ..................... 10 2016 221 464.0

(51) Int. Cl.
*G03F 7/20* (2006.01)
*B29C 59/16* (2006.01)
(Continued)

(52) U.S. Cl.
CPC .......... *G03F 7/70416* (2013.01); *B29C 59/16* (2013.01); *G02B 6/305* (2013.01);
(Continued)

(58) Field of Classification Search
CPC ............. G03F 7/70416; G03F 7/70408; G03F 7/0037; G03F 7/2051; G03F 7/2053; G02B 6/4204; G02B 27/0938; G02B 6/32
See application file for complete search history.

(56) References Cited

U.S. PATENT DOCUMENTS 6,253,004 B1 6/2001 Lee et al.
6,302,593 B1 10/2001 Haake
(Continued)

FOREIGN PATENT DOCUMENTS

DE 199 29 878 A1 1/2001
EP 0 940 701 A2 9/1999
(Continued)

OTHER PUBLICATIONS

International Search Report, PCT/EP2017/078086, Jan. 29, 2018, 3 pages.
(Continued)

*Primary Examiner* — Ryan D Howard
(74) *Attorney, Agent, or Firm* — Bose McKinney & Evans LLP

(57) ABSTRACT

An optical system and a method for producing it is disclosed. The optical system has at least two separate optical components and an optical connection between them. In the inventive method, first and second optical component are provided, each having respective beam profiles. An arrangement of the first and second optical components and the form and target position of at least one beam-shaping element are specified. The beam-shaping element is produced using a three-dimensional direct-writing lithography method in situ at the target position to thereby obtain an optical component supplemented by the beam-shaping element. The supplemented optical component is placed and fixed on common base plate to thereby obtain the optical system. The optical systems produced with the present method can be used in
(Continued)

optical data transfer, measurement technology and sensors, life sciences and medical technology, or optical signal processing.

17 Claims, 19 Drawing Sheets

Related U.S. Application Data continuation of application No. PCT/EP2017/078086, filed on Nov. 2, 2017.

(51) Int. Cl.
*G02B 6/30* (2006.01)
*G02B 6/32* (2006.01)
*G02B 6/42* (2006.01)
*G02B 27/09* (2006.01)
*G03F 7/00* (2006.01)
*G02B 6/12* (2006.01)
*G02B 6/138* (2006.01)

(52) U.S. Cl.
CPC .............. *G02B 6/32* (2013.01); *G02B 6/4204* (2013.01); *G02B 27/0938* (2013.01); *G03F 7/2053* (2013.01); *G02B 2006/12147* (2013.01); *G02B 6/138* (2013.01)

(56) References Cited

U.S. PATENT DOCUMENTS

| | | |
|---|---|---|
| 8,903,205 B2 | 12/2014 | Koos et al. |
| 8,968,987 B2 | 3/2015 | Atta et al. |
| 9,002,157 B2 | 4/2015 | La Porta et al. |
| 2002/0097957 A1 | 7/2002 | Kikuchi et al. |
| 2004/0202477 A1 | 10/2004 | Nagasaka et al. |
| 2005/0271983 A1 | 12/2005 | Payne |
| 2008/0142815 A1 | 6/2008 | Morioka |
| 2009/0218519 A1 | 9/2009 | McLeod |
| 2013/0221550 A1 | 8/2013 | Koos et al. |
| 2015/0323748 A1 | 11/2015 | Contag |
| 2016/0046070 A1 | 2/2016 | Mappes et al. |
| 2016/0356971 A1* | 12/2016 | de Jong ............... B29C 64/135 |
| 2018/0239096 A1 | 8/2018 | Houbertz et al. |

FOREIGN PATENT DOCUMENTS

| | | |
|---|---|---|
| EP | 0 781 423 B1 | 11/2000 |
| EP | 3 130 950 A1 | 2/2017 |
| JP | H05-107427 A | 4/1993 |
| JP | H06-337333 A | 12/1994 |
| JP | H09-243869 A | 9/1997 |
| JP | 2001-021771 A | 1/2001 |
| JP | 2005-173195 A | 6/2005 |
| JP | 2006-154868 A | 6/2006 |
| JP | 2008-502008 A | 1/2008 |
| JP | 2011-248312 A | 12/2011 |
| WO | WO 2011/044606 A1 | 4/2011 |
| WO | WO 2015/134566 A1 | 9/2015 |

OTHER PUBLICATIONS

Dietrich et al., "Lenses for Low-Loss Chip-to-Fiber and Fiber-to-Fiber Coupling Fabricated by 3D Direct-Write Lithography," 2016 Conference on Lasers and Electro-Optics (CLEO), OSA, Jun. 5, 2016, 2 pages.

Nguyen et al., "SU-8 Lenses: Simple Methods of Fabrication and Application in Optical Interconnection Between Fiber/LED and Microstructures," Journal of Electronic Materials, Mar. 3, 2016, vol. 45, No. 5, pp. 2529-2535.

Zukauskas et al., "Improvement of the Fabrication Accuracy of Fiber Tip Microoptical Components via Mode Field Expansion," Journal of Laser Micro/Nanoengineering, 2014, vol. 9, No. 1, pp. 68-72.

Fu et al., "Integrated Micro-Cylindrical Lens with Laser Diode for Single-Mode Fiber Coupling," IEEE Photonics Technology Letters, 2000, vol. 12, No. 9, pp. 1213-1215.

Thiele et al., "Ultra-compact on-chip LED collimation optics by 3D femtosecond direct laser writing," Optics Letters, Jul. 1, 2016, vol. 41, No. 13, pp. 3029-3032.

Gissibl et al., "Two-photon direct laser writing of ultracompact multi-lens objectives," Nature Photonics, Aug. 2016, vol. 10. pp. 554-560.

Schneider et al., "Optical coherence tomography system mass-producible on a silicon photonic chip," Optics Express, Jan. 25, 2016, vol. 24, No. 2, pp. 1573-1586.

Blaicher, "Towards Scalable Hybrid 2D-3D Nanophotonic Circuits," Master Thesis, Karlsruher Institut für Technologie, Oct. 8, 2014, 135 pages.

\* cited by examiner

Fig. 1a
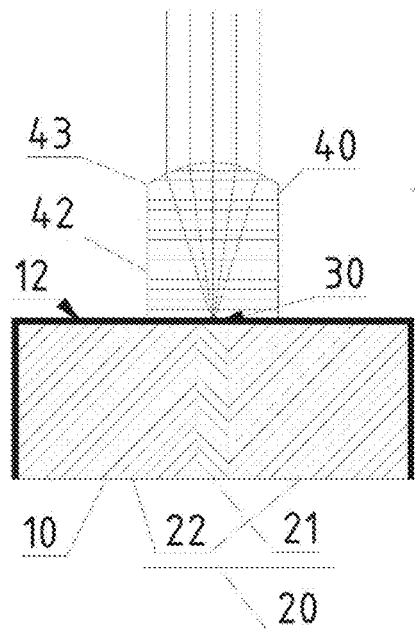
Fig. 1b
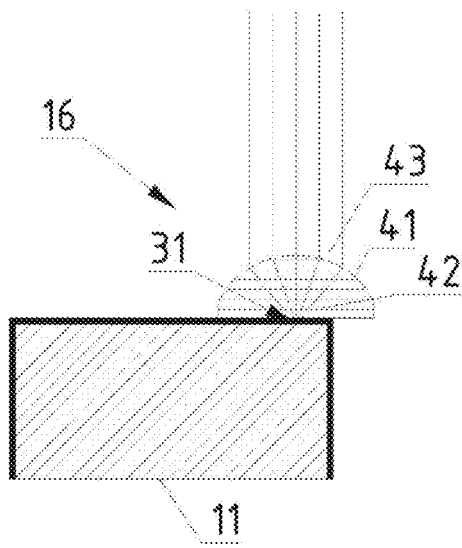
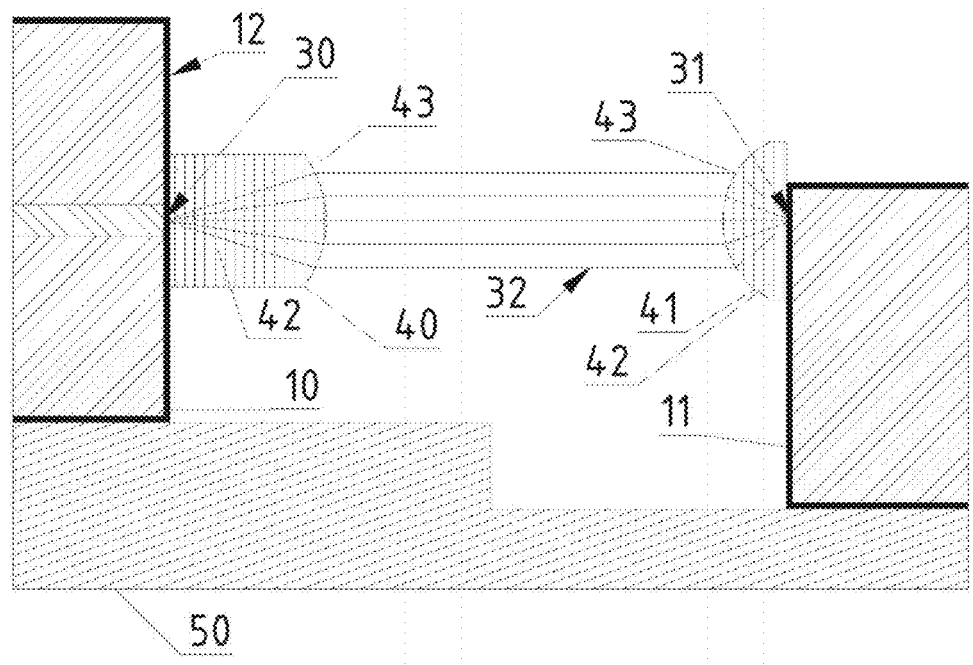
Fig. 2

Fig. 3a
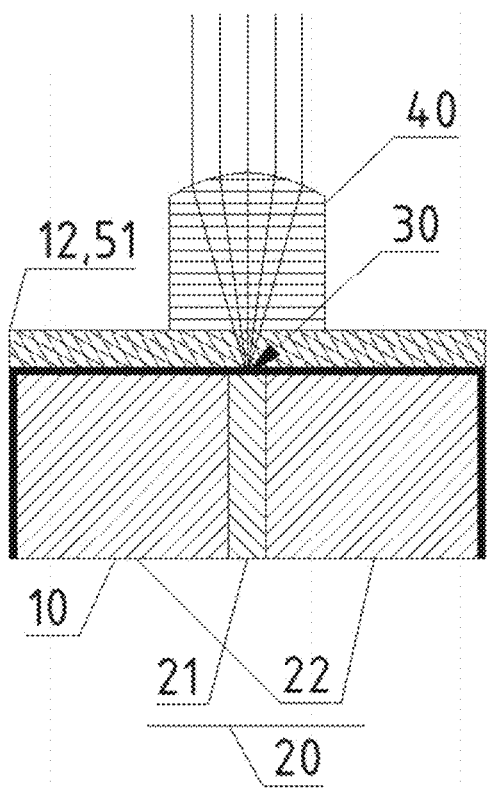
Fig. 3b
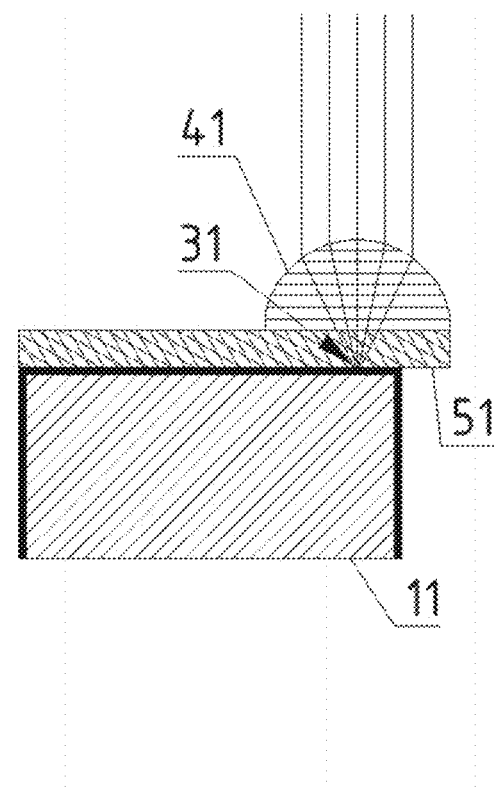
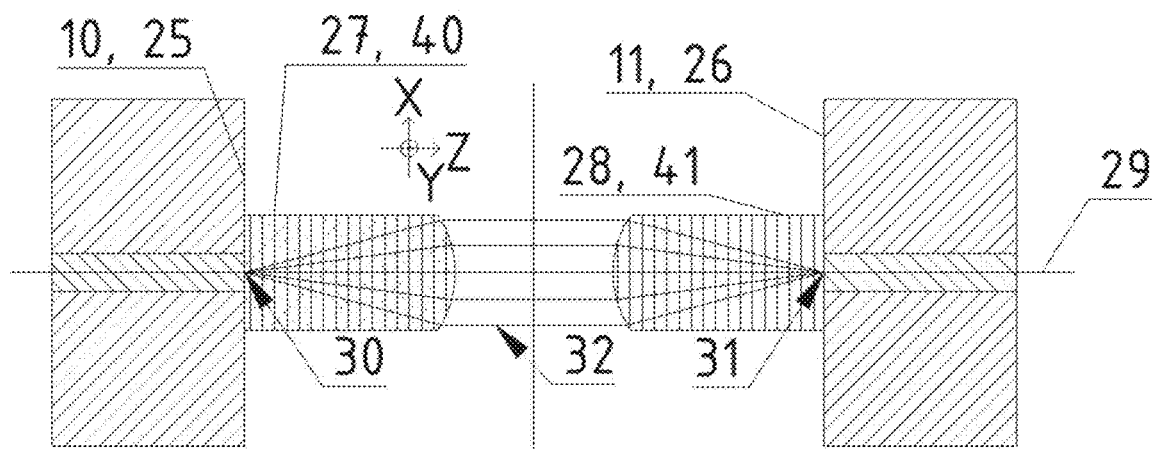
Fig. 4

METHOD FOR PRODUCING AN OPTICAL SYSTEM AND OPTICAL SYSTEM

RELATED APPLICATIONS

This application is a divisional of U.S. Ser. No. 16/399,492, filed on Apr. 30, 2019, which is a continuation of PCT/EP2017/078086, filed on Nov. 2, 2017, which claims priority to DE 10 2016 221 464.0, filed on Nov. 2, 2016, the entire disclosures of all of which are hereby incorporated herein by reference in their entirety.

BACKGROUND

This disclosure is in the field of optics, in particular micro-optics, and relates to an optical system having at least two separate optical components and at least one optical connection between the two optical components, and to a method for producing it. The optical components can be, for example, glass fibers or photonic integrated circuits (PIC), which can comprise, among other things, photodetectors, light sources, modulators, or passive optical structural elements such as power splitters or filters. Other types of optical components are conceivable.

The optical connection, which can also be referred to as "optical coupling," in this context comprises an arrangement by way of which light can be transmitted between a first optical component and a second optical component. This arrangement can include beam-shaping optical elements with which a propagation direction and/or shape of the light emitted by one of the components or the light received by the other one of the components can be modified.

In many cases, the desire is for losses to be kept as low as possible in the case of the optical coupling. The term "coupling efficiency" used in this context describes the quotient of the optical power that is received by a receiving optical component and the optical power that is emitted by an emitting optical component.

The optical systems produced with the method of this disclosure can preferably be used in optical data transfer, measurement technology and sensors, life sciences and medical technology, or optical signal processing. Further applications of use are conceivable.

One critical step concerning the setup of optical systems is the optical connection between the optical components making up the system. For optical coupling with low loss, two aspects are of particular importance: First, the optical components to be connected are adjusted with respect to one another and fixed such that the light emitted by a facet of a first structural element is incident on the facet of the second structural element at a specific location and from a specific direction. To this end, the components to be connected are advantageously adjusted and mounted with a high degree of precision regarding both their position and their orientation. In addition, the light emitted by the first component should have an advantageous field distribution at the facet of the second component so as to achieve the highest possible coupling efficiency. These two aspects are the focus of the coupling methods used today.

The term "facet" of an optical component in this context relates to the surface of a light-emitting optical component which is traversed last by the light upon emission. Conversely, the facet of a light-receiving optical component designates the surface of the optical component that is struck first by the light upon the optical component receiving it. The terms "mode field" or "beam profile" both describe a field distribution of a light field emitted by an optical component, wherein a distinction can be made between the mode field at the facet of the optical component and in a plane at a specific further position. "Changing the mode field" refers to influencing the mode field with respect to its propagation in the beam direction. This change can consist here in particular of a collimation, expansion or focusing using a beam-shaping component. The term "mode field diameter" describes a spatial extent of the intensity distribution of a specific mode emitted by an optical component. In the case of frequently occurring Gaussian beam profiles, the spatial extent is defined for example by the diameter of the region in which the intensity of the light is more than $1/e^2$, i.e., more than approximately 13.5%, of the maximum intensity of the light. In non-rotation-symmetric beam profiles, such as elliptical beam profiles, a distinction is typically made between a maximum and a minimum diameter.

The term "positioning accuracy" relates to the sum of all static and systematic deviations of an actual position of the two optical components after positioning and fixing as compared to a target position. Large mode field diameters generally result in a great positioning tolerance with respect to translational positioning, while small mode field diameters result in a low positioning tolerance with respect to translational positioning. The positioning tolerance in this context describes a dependence of the coupling efficiency on the deviation of the actual position of an optical component from the target position with maximum coupling. A large positioning tolerance is characterized by a low dependence of the coupling efficiency on the deviation of the actual position from the target position.

With respect to an adjustment of optical structural elements when assembling systems, a distinction is made between what are referred to as active positioning methods and passive positioning methods. In passive positioning methods, the adjustment of the optical components to be connected relative to one another is typically accomplished using mechanical structures such as stops or mounts for optical components, often with the aid of imaging methods. These methods can be implemented relatively easily, although the attainable accuracies are limited. This becomes a problem in particular when the optical components to be connected have laterally single-mode waveguides with a high refractive-index difference between waveguide core and cladding. In this case, the field distribution on the structural element facet is determined by the mode field of the respective waveguide, which in many cases can have diameters of a few micrometers or even less than 1 μm. For example, waveguides made of indium phosphide (InP) or silicon have a mode field diameter of one micrometer or less. These mode field diameters can be increased by way of narrowings, also referred to as "tapers," or widenings of the waveguide to typically 2 μm to 4 μm; however, in many cases this may lead to a strongly elliptical mode field.

A high coupling efficiency requires positioning accuracies in the order of magnitude of a fraction of said mode field diameters and is therefore in many cases not achievable by way of passive alignment methods due to mechanical tolerances or limited resolution of the imaging methods used. Passive alignment methods are therefore used primarily for the optical coupling of components with multi-mode optical waveguides, in which the distribution of the input-coupled or output-coupled field in the structural element facet has a significantly larger diameter of frequently significantly more than 10 μm and the requirements in terms of the positioning accuracy of the structural element are thus correspondingly reduced. However, such multi-mode photonic systems are highly limited in terms of their performance, which can make itself felt in communication systems for example in a maximally transmittable data rate or the length of a transmission link. For this reason, optical systems with transversally single-mode waveguides are preferred in many cases.

For coupling single-mode waveguides having small mode field diameters, on the other hand, active alignment methods are mostly used, in which the coupling efficiency is continuously measured and maximized during the alignment process. These methods work without mechanical stops or high-resolution imaging methods, but it becomes necessary here for light to be emitted by one of the components to be connected and for the portion of light that is coupled into the second component to be metrologically determined. This typically requires an electrical or optical contact connection of the two components and consequently a relatively complex method, which in many cases necessitates a significant amount of manual work steps. Moreover, adhesive bonding methods are frequently used to attach the structural elements after assembly. To prevent shrinkage of the adhesive from potentially causing a misalignment of the structural elements, the coupling efficiency should in many cases be monitored and maintained during the entire curing process of the bonding location. This has the effect of a comparatively low throughput in active alignment methods and consequently of correspondingly high costs for optical construction technology that frequently exceed the costs of the optical components used. In many cases, coupling components with small mode fields is actually impossible in principle. This applies for example to the simultaneous optical connecting of components that each have a plurality of coupling locations, the positions of which relative to one another have deviations in the order of magnitude of the mode field diameters due to the manufacturing process. An important example is the coupling of a plurality of glass fibers which have been combined to form what is known as an array. The variation of the distance of individual fibers is here up to a few micrometers, which means that the simultaneous adjustment of all glass fibers with respect to a waveguide array having small mode field diameters is difficult.

In addition to the great demands with respect to the coupling efficiency, in many cases there is the problem that the optical field distributions at the facets of the optical components to be connected greatly deviate from one another in terms of amplitude and/or phase, which even with optimum positioning results in a comparatively low coupling efficiency. In many cases this makes necessary additional elements, such as microlenses having spherical, cylindrical or generally aspheric shapes, which are likewise positioned with very great accuracy between the optical components to be connected. Not only does this significantly increase the number of the degrees of freedom in the alignment and thus the alignment complexity, but it also results in relatively large arrangements which are frequently unable to meet the specifications regarding compactness and robustness that are required in practice. The large number of the degrees of freedom that are to be optimized greatly complicates the assembly. In addition, great reflection losses and back-reflections that can constitute a problem in particular when coupling to light sources such as lasers or superluminescent diodes (SLEDs) can occur in the case of a large number of optical surfaces in the beam path.

If a glass fiber is coupled to an optical chip, mode field adaptation can also be achieved by way of a lensed fiber, wherein the lensed fiber designates a correspondingly curved surface of the fiber facet which here exhibits the function of a focusing lens. The curved surface of the fiber facet can be obtained for example by melting, etching or polishing. This method was developed for individual fiber-chip connections and has already been used in this context for many years for coupling single-mode fibers to laser diodes. However, the attainable coupling losses are relatively high, especially if the mode field illuminated by the optical chip has an elliptical cross section. This is primarily due to insufficient control over the exact shape of the focusing glass surface. Moreover, the method can be transferred only with great difficulty to coupling with fiber arrays, because the production of the lensed fibers is typically possible only for individual fibers.

Optical chips can be coupled to the chip edge not only by way of waveguide facets but also by way of corresponding coupling structures on the chip surface. Such methods are currently used primarily when coupling what are known as silicon photonics chips. Here, a fiber or an array of fibers is directed at an acute angle, in particular of nearly 90°, onto a grating integrated on the optical chip which diffracts the light into the chip plane and focuses it into the corresponding waveguide. This concept permits optical coupling of waveguides on the entire chip and has in particular the advantage that it does not require complicated preparation of waveguide facets on the chip edge. It thus becomes possible to singulate chips during the production using a simple sawing method, whereas in the case of coupling via the waveguide edge significantly more complicated splitting methods, possibly in combination with subsequent polishing or etching processes, are used. However, grating couplers in many cases exhibit relatively high losses and additionally permit efficient coupling only over a relatively narrowband spectral range.

As an alternative approach, U.S. Pat. No. 8,903,205 B2 discloses a method for connecting optical components using polymer waveguides (photonic wire bonds, PWB), which are produced in situ by a three-dimensional direct-writing lithography method. The optical components to be connected are initially fastened here with low accuracy on a common base plate and subsequently connected to one another using polymer waveguides. This method does not require highly accurate alignment of the optical components to be connected, because the shape of the polymer waveguides can be adapted to the actual position of the components. However, the concept has a few limitations with respect to the architecture of the micro-optical systems that are to be produced therewith. For example, photonic wire bonds always require a mechanical connection of the optical elements via a polymer waveguide, which is not possible in many cases, for example if the distance of the optical elements is significantly greater than the writing fields of conventional lithography systems suitable for producing PWBs. Similarly, optical connections via photonic wire bonds are not releasable and can in particular not be used for producing pluggable connections. Moreover, the accessibility of the coupling locations of the optical components to be connected poses a problem during photonic wire-bonding. The work process described here makes provision of the fact that the optical components are first fixed to a common structural-element carrier, and that the resulting multi-chip module is provided only in a second step with lithographically produced photonic wire bonds. Since lithography systems having a high numerical aperture are necessary herefor, photonic wire bonds can be produced practically only on the upper surface or on other outwardly facing surfaces of the multi-chip module; addressing of coupling locations inside the module or in a housing associated with the module would result in disturbance or shadowing of the lithography beam and is therefore not realizable. Similarly, it is not possible using photonic wire bonds to stack optical components in the form of chips (chip stacking) and to optically connect the different layers to one another. In addition, the electrical connection of the optical components in which for example metallic wire bonds are used should be designated such that the optical coupling locations remain accessible. This frequently requires a comparatively complex manufacturing procedure, in which the production of optical and electronic connections is alternated. A further disadvantage relates to the downstream steps that are part of the lithography method, for example the treatment of the exposed photoresist with a developer to free the produced waveguide structures, in which the entire multi-chip module is brought into contact with a solvent and should correspondingly preferably be made of chemically resistant materials. Finally, polymer waveguides frequently require a cladding material which surrounds them to set the refractive index contrast, which makes the method even more complicated.

U.S. Pat. No. 9,002,157 B2 discloses a method for lithographically producing a three-dimensional photonic component, which comprises at least two optical elements which are adjusted precisely with respect to one another and between which light is transmitted. Great accuracy of the relative adjustment of the optical elements is achieved by way of their production in a single operation using two-photon lithography. This method thus relates to an optical component, which is produced in one step completely by three-dimensional direct-writing lithography and contains elements which are precisely adjusted with respect to one another. The combination of existing optical components with further additional elements produced by way of lithography is not addressed. Correspondingly, the method also does not allow robust and efficient coupling between existing optical components.

EP 0 940 701 A2 discloses an arrangement for coupling an elliptical mode field of an edge-emitting laser into a single-mode fiber with a rotation-symmetric mode field with as few losses as possible. The arrangement comprises a discrete combination of a focusing lens and an anamorphic microlens, which are each positioned individually in the beam path. To lower the requirements with respect to the positioning accuracy, the anamorphic microlens is positioned in the vicinity of the fiber facet and the focusing lens in the vicinity of the laser facet. Since the focusing lens and the anamorphic microlens are precisely individually adjusted and fixed in 5 or 6 degrees of freedom relative to the laser or fiber facet, a significant assembly effort is required.

U.S. Pat. No. 8,968,987 B2 discloses the production of optical mirrors in vias (through-holes) in an optical printed circuit board using a three-dimensional direct-writing lithography method. The mirrors serve for optical coupling of waveguides embedded in the printed circuit board. The concept does not mention how the light beams to be coupled in are produced, that is to say it neither focuses on the coupling to a second optical component nor on the associated aspects of beam-shaping or mechanical tolerances.

Zukauskas et al., *Improvement of the Fabrication Accuracy of Fiber Tip Microoptical Components via Mode Field Expansion*, Journal of Laser Micro/Nanoengineering Vol. 9, No. 1, pages 68-72, 2014, describe the production of a structure using 3D two-photon lithography on the facet of a single-mode fiber. The structure produced here is written at as great a distance from the facet of the single-mode fiber as possible so as to lower the accuracy requirements during placement of the structure relative to the fiber core. The document does not focus on coupling to further optical structural elements, such as integrated chips.

Y. Fu et al., *Integrated Micro-Cylindrical Lens with Laser Diode for Single-Mode Fiber Coupling*, IEEE Photonics Technology Letters, Vol. 12, No. 9, page 1213, 2000, describe an approach for producing a cylindrical lens on lasers using focused ion beams (FIB). A subtractive method is used here, that is to say material is removed from the structural element facet to produce a surface having a refractive effect. However, the production of only at most one beam-shaping surface per optical component is possible in this way. In addition, expanding the mode field to lower the accuracy requirements during the positioning of structural elements is not possible, or possible to only a very limited degree, using this method. In addition, the production method can result in damage to the crystal lattice of the laser and is not suitable for all structural elements. Furthermore, production methods using FIB are not scalable because they are very slow and costly.

S. Thiele et al., *Ultra-compact on-chip LED collimation optics by 3D-printing*, Opt. Lett. 41, page 3029, 2016, describe the production of 3D freeform optics for beam-shaping the light produced by a light-emitting diode (LED). Coupling to further optical components is not possible with the freeform optics described therein, which are designed for light fields having a large number of lateral modes.

T. Gissibl et al., *Two photon direct laser writing of ultracompact multi-lens objectives*, Nature Photonics 10, 2016, describe the production of macroscopic freeform optics on a single-mode optical fiber using 3D print, wherein possibilities for beam-optical adaptation of the beam divergence are indicated. However, an application for optical connections is not mentioned.

Schneider et al., *Optical coherence tomography system mass-producible on a silicon photonic chip*, Opt. Express 24, pages 1573-1586, 2016, describe the production of a lens using 3D lithography on a micro-optical chip and coupling experiments in fibers. However, a beam-shaping optical element was written here only onto one optical component, and the beam was focused onto the facet of the glass fiber, but no increase in positioning tolerances beyond the mode field diameter of the glass fiber can be achieved thereby. In addition, in the experiment described in the publication, the components were placed relative to one another using micropositioning stages only for a temporary coupling.

Dietrich et al., *Lenses for Low-Loss Chip-to-Fiber and Fiber-to-Fiber Coupling Fabricated by 3D Direct-Write Lithography*, Conf. on Lasers and Electro-Optics (CLEO' 16), Paper SM1G.4., 2016, describe the production of a lens using 3D lithography on an optical fiber and coupling experiments with lasers. However, a beam-shaping optical element was written here only onto one optical component, whereby no increase in positioning tolerances beyond the mode field diameter of the involved optical components could be achieved. In addition, here, too, the components were placed relative to one another using micropositioning stages only for a temporary coupling.

M. Blaicher, *Towards Scalable Hybrid 2D-3D Nanophotonic Circuits*, final master's thesis, Karlsruher Institut für Technologie, 2014, discloses a waveguide-lens combination produced by micro-3D print, which effects output coupling of light that is guided in a planar integrated waveguide in a direction perpendicular to the substrate surface. These structural elements consist of printed waveguides, which can deflect light from a silicon-photonic waveguide into a perpendicular direction and emit it via a lens into the free space.

EP 3 130 950 A1 discloses deflection elements which are additively manufactured on optical components using direct-writing lithography methods and which make it possible to deflect a light beam, emitted perpendicularly to the substrate plane by a surface-emitting structural element, into a direction parallel to the substrate plane and to specify height and the diameter of the beam independently of one another in the process.

In addition, further optical systems including separate optical components and at least one optical connection between the optical components, and methods for producing them, are known. DE 199 29 878 A1 discloses a carrier for assembling optoelectronic components for a light-guide system, comprising planar mirror structures or mirror structures provided with a relief which are produced using conventional silicon microstructuring. U.S. Publication No. 2008/0142815 A1 describes an optical module holder serving for connecting optoelectronic components and optical fibers, wherein initially a module holder is produced integrally from a resin material using injection molding and then an optical fiber and/or optoelectronic components is/are introduced and fixed in a cutout provided therefor. EP 0 781 423 B1 discloses an arrangement of a plurality of discrete lenses, which are positioned with respect to one another and fixed using a silicon microstructure. U.S. Pat. No. 6,302,593 B1 describes a system, in which gradient index lenses (GRIN lenses) are adjusted relative to the facets of pre-assembled optical fibers using integrated micro-manipulation systems. U.S. Pat. No. 6,253,004 B1 describes a coupling structure for connecting an optoelectronic component and a single-mode fiber, with which the positioning tolerance can be increased. Beam-shaping elements, such as a microlens structured on a rear side of a GaAs wafer or a gradient index lens placed at an end of a single-mode fiber, are used here. The highly precise structuring of the microlens on the rear side of the wafer here requires specific production processes and is additionally applicable only to a specific class of optoelectronic structural elements.

SUMMARY

Proceeding herefrom, this disclosure provides a method and an apparatus that at least partially overcomes the stated disadvantages and limitations of the prior art.

In particular, a method is provided which permits the optical interconnection of optical components, which may have the same or different mode field diameters, in a robust and automatable assembly process with as little loss as possible. An efficient optical connection is possible here in particular also for broadband light, that is to say for light having different wavelengths. The assembly process should here have requirements which are as low as possible in terms of positioning accuracy and as a result should as far as possible be able to build on passive positioning methods. For effective assembly, the number of the mechanical degrees of freedom in the assembly process should be kept as low as possible. In this connection, the use of additional discrete optical elements, such as microlenses, for adapting different field distributions in the facets of the optical components to be connected should also be avoided. In addition, the method should have requirements which are as low as possible in terms of accuracies and surface qualities in the case of singulating optical chips before assembly and should be universally applicable to a large number of different optical components.

The words "have," "include," or "comprise," or any desired grammatical deviations therefrom will be used below in a non-exclusive manner. Accordingly, these words can relate both to situations in which no further features in addition to the features introduced by those words are present, and to situations in which one or more further features are present. For example, the expression "A has B", "A includes B", or "A comprises B" can relate both to the situation in which no further element in addition to B is present in A (i.e., to a situation in which A consists only of B), and to the situation in which, in addition to B, one or more further elements are present in A, such as element C, elements C and D, or even further elements.

It should furthermore be pointed out that the expressions "at least one" and "one or more" and grammatical deviations of these expressions when used in connection with one or more elements or features, if said expressions are intended to express that the element or feature may be provided once or multiple times, are generally only used once, for example upon first introduction of the feature or element. If the feature or element is subsequently mentioned again, the corresponding term "at least one" or "one or more" is generally not used again, without limiting the possibility that the feature or element may be provided once or multiple times. In the same connection, it shall be understood for purposes of this disclosure and appended claims that, regardless of whether the phrases "one or more" or "at least one" precede an element or feature appearing in this disclosure or claims, such element or feature shall not receive a singular interpretation unless it is made explicit herein. By way of non-limiting example, the terms "optical component," "beam shaping element" and "optical chip," to name just a few, should be interpreted wherever they appear in this disclosure and claims to mean "at least one" or "one or more" regardless of whether they are introduced with the expressions "at least one" or "one or more." All other terms used herein should be similarly interpreted unless it is made explicit that a singular interpretation is intended.

Furthermore, the words "preferably," "in particular," "for example," or similar words are used below in connection with optional features without alternative embodiments being limited hereby. For example, features which are introduced by these words are optional features, and there is no intention of limiting the scope of the claims and in particular of the independent claims by these features. For example, the invention, as will be understood by a person skilled in the art, can also be performed using different configurations. Similarly, features introduced by way of "in an embodiment of the invention" or by way of "in an exemplary embodiment of the invention" are understood to be optional features, without alternative configurations or the scope of the independent claims being intended to be limited hereby. Furthermore, these introducing expressions are not intended to touch upon all possibilities of combining the features introduced hereby with other features, be it optional or non-optional features.

In a first aspect, this disclosure relates to a method for producing an optical system, having at least two separate optical components and at least one optical connection between the two optical components. As already described, the optical connection, which can also be referred to as "optical coupling," comprises a device that is capable of optical guidance and ensures that light can be transmitted, preferably with as little loss as possible, between a first optical component and a second optical component, in particular from one of the optical components to the second optical component and/or from the second optical component to the first optical component. A quality of optical coupling can be indicated by the term "coupling efficiency,"

which designates a quotient of an optical power that is received by a receiving optical component and the optical power that is emitted by an emitting optical component, wherein—depending on the arrangement of the optical components in the optical system—the first or the second optical component can be used as the receiving or emitting optical component.

The present method comprises the following steps, which are preferably performed in the stated order, starting with step a) and finishing with step d), wherein one or more, in particular successive steps can also be performed at least partially at the same time:

a) providing at least one first optical component and at least one second, separate optical component, wherein the first optical component has a first beam profile and the second optical component has a second beam profile;
b) designing the optical system by specifying an arrangement of the first optical component and the second optical component and of form and target position of at least one beam-shaping element, wherein the beam-shaping element is fixedly connected to the first optical component and/or to the second optical component, wherein the beam-shaping element is designated to change the first beam profile and/or the second beam profile such that, after positioning of the first optical component and of the second optical component, an optical coupling between the first optical component and the second optical component is formed;
c) producing the beam-shaping element using a three-dimensional direct-writing lithography method in situ at the target position, as a result of which an optical component which is supplemented by the beam-shaping element is obtained; and
d) positioning and fixing the optical component, which is supplemented by the beam-shaping element, on a common base plate, as a result of which the optical system is obtained.

In a particularly preferred configuration, two separate beam-shaping elements can be used such that the above-mentioned steps b) to d) are performed as follows:

b) designing the microoptical system by specifying an arrangement of the first optical component and the second optical component and of form and target position of a first beam-shaping element and a second beam-shaping element, wherein the first beam-shaping element is fixedly connected to the first optical component and the second beam-shaping element is fixedly connected to the second optical component, wherein the first beam-shaping element is designated to change the first beam profile and the second beam-shaping element is designated to change the second beam profile such that, after positioning of the first optical component and of the second optical component, an optical coupling between the first optical component and the second optical component is formed;
c) producing the first beam-shaping element and the second beam-shaping element using a three-dimensional direct-writing lithography method in situ at the target positions of the first microoptical component and of the second microoptical component, as a result of which a first microoptical component which is supplemented by the first beam-shaping element and a second microoptical component which is supplemented by the second beam-shaping element are obtained; and
d) positioning and fixing the optical component which is supplemented by the first beam-shaping element and the optical component which is supplemented by the second beam-shaping element on a common substrate, as a result of which the optical system is obtained.

In accordance with step a), the optical components to be connected are provided and information relating to the associated beam profiles of the optical components is provided. To this end, preferably each of the optical components is selected from the group comprising single-mode fibers or multi-mode fibers made of organic or inorganic materials, semiconductor-based integrated optical chips such as lasers, photodiodes, superluminescent diodes, or silicon photonics chips, or other integrated optical chips on the basis of semiconductors or dielectric materials such as glasses, silicon dioxide, silicon nitride, or polymers, optical printed circuit boards, or elements for free beam optics such as lenses, beam splitters, isolators, mirrors or diffraction gratings. The optical components can have optical waveguides with low index contrast (for example glass-based optical waveguides) or with a medium or high index contrast (for example semiconductor-based waveguides). Input coupling and output coupling of light can be performed at the edge of an optical component, for example at the chip edge in edge-emitting lasers or waveguide-based systems having corresponding facets, or on the upper surface, for example in surface-emitting lasers (vertical cavity surface emitting lasers, VCSEL), in surface-illuminated photodiodes, or in waveguide-based chips with corresponding coupling structures (e.g., grating couplers, deflection mirrors). Information relating to the corresponding beam profiles can be derived from design data of the structural elements and/or be metrologically obtained using a commercial device for (laser) beam diagnostics ("beam profiler") during or before the assembly process. Metrological methods are particularly suitable when structural-element-specific deviations of the shape and position of the beam profile are to be individually captured and used for designing the beam-shaping elements in step b). It is possible in this way to compensate manufacturing-related tolerances of the optical components, which are otherwise difficult to avoid, by way of a corresponding configuration of the beam-shaping elements.

In accordance with step b), the optical system to be implemented, which comprises both the target positions of the optical components to be connected and the planning of the three-dimensional shape of the associated beam-shaping elements and the target position thereof relative to the respective optical component, is designed. In many cases, a first design of the system already exists, which contains at least the arrangement and the coarse target positions of the optical components to be connected, with the result that only a possible adaptation of said target positions to individual particularities, such as manufacturing-related tolerances of the optical components, may be taken into account. The target position can here have both a lateral position in the base plate plane and a vertical position perpendicular to the base plate plane. In a particular configuration, the target position can also be defined in that, in particular for the case of a well-collimated light beam, the target position can be defined along the propagation direction of the collimated beam selectively over a specific region.

The positioning of the optical elements to be connected can preferably be effected such that the optical axes of the beam profiles are adjusted to be collinear with respect to one another, with the result that the facets of two optical components lie opposite one another. In this case, merely an adaptation of the mode fields is effected by way of the beam-shaping elements. Alternatively, the positioning can be effected such that the axes of the beam profiles are located in a common plane, but are not collinear with respect to one another. In this case, the beam-shaping elements will effect, in addition to an adaptation of the mode fields, preferably also an adaptation of the propagation direction of the modified beam profiles. The axes of the unmodified beam profiles can include any desired angle here. In order to utilize the known effect of total internal reflection when producing the beam-shaping elements, it is also possible in particular to use angles that deviate from 90°, as a result of which a sufficiently flat incidence of light on the totally reflective surface can be made possible.

During step b), furthermore the at least one beam-shaping element is designed which influences the beam profiles of the optical components to be connected such that, for given mechanical tolerances, low-loss coupling between the optical components is possible. The aim is to produce an optical coupling with low losses, which has a positioning tolerance which is sufficiently great for the assembly system used. In many cases, a tolerance of the rotational adjustment accuracy and a tolerance of the translational positioning accuracy must be weighed against one another. Increasing the tolerance of the translational positioning accuracy can typically be associated with a widening of the mode field diameter, which results in a reduction of the beam divergence and consequently in a reduced tolerance of the rotational adjustment accuracy. If required, it is possible using a suitable design of the beam-shaping element to additionally compensate manufacturing-specific individual variations in the form and position of mode fields in the optical components.

In order to further reduce coupling losses, it may be advantageous to provide later embedding in an optically transparent embedding medium having a refractive index that deviates from the beam-shaping elements and to take this into account in the design of the overall system to be implemented. This can result in a changed form and number of the beam-shaping elements.

For beam-shaping, elements can be used which can at least partially consist of an optically transparent region, which can immediately adjoin the facet of the respective structural element and, in a given mode field diameter, lead to a smaller divergence angle of the beam exiting the facet. In the case of optical connections with high power, on the other hand, it may be advantageous to structure the beam-shaping elements at the locations at which the mode field can have already expanded due to propagation in free space, with the result that the power density in the region of the beam-shaping elements remains low.

For designing the at least one beam-shaping element, simulations can be performed. In a preferred embodiment, the optical connection is designated such that the beam profiles, modified by the beam-shaping element or the beam-shaping elements, of the optical elements to be connected have a large beam diameter with low divergence. The size of the mode field diameter at a wavelength of 1.55 μm can preferably have a value here of 5 μm to 100 μm, particularly preferably 10 μm to 80 μm, in particular 15 μm to 50 μm. The beam-shaping element can consist of one or more parts, which are produced in one or more operations using a three-dimensional direct-writing lithography method with high precision in the local coordinate system of the respective component.

In a preferred embodiment, the beam path of the optical connection can in particular have the following portions:
(i) A beam-expanding portion, which is characterized in that the beam diameter in this portion increases. The beam-expanding portion can use the natural divergence of the light field exiting the optical element and/or modify the light field by way of a sub-element of the beam-shaping element. The divergence can be increased in particular using concave lenses, convex mirrors or diffractive elements, which can be produced using a method for 3D structuring, e.g., using two-photon lithography. A further possibility for expanding can consist in producing a waveguiding structure, which initially decreases the mode field diameter. With a subsequent propagation of the beam outside the optical component in free space, this can result in a great divergence. The divergence of the light beam in the beam-expanding portion and/or a fictitious continuation of the light beam in a far field can preferably be at most 6°, with particular preference at most 15°, in particular at most 30°, being defined as the half opening angle with respect to an intensity of 13.5% of the maximum intensity.
(ii) A collimated portion, which is characterized in that the beam diameter only changes slightly within this portion. In a transition region between the beam-expanding portion and the collimated, expanded portion, a collimating optical element can preferably be used, for example a concave mirror or a convex lens. Here, for example, a beam waist can form. The "beam waist" can here be located at a position of a Gaussian or Gaussian-like beam, at which a substantially plane phase front occurs. The size of the beam waist, that is to say the waste diameter, at a wavelength of 1550 nm can preferably have a value of 5 μm to 100 μm, with particular preference from 10 μm to 80 μm, in particular from 15 μm to 50 μm. The associated beam divergence with respect to the half opening angle is obtained from relevant equations for Gaussian beams and is preferably at most 12°, in particular preferably at most 6°, in particular at most 4°. At wavelengths above and below 1550 nm, these values can change accordingly. Preferably, the field distribution produced by the first beam-shaping element here as much as possible corresponds to the field distribution which is coupled from the second beam-shaping component with maximum efficiency into the second optical component.
(iii) A beam-narrowing portion, which is characterized in that the beam diameter decreases again here. The configuration of the beam-narrowing portion can be effected here analogously to the measures which are described in section (i).

After the design of the beam-shaping elements, the elements can preferably be converted to a machine-readable data set for subsequent manufacturing in accordance with step c). The transfer to a machine-readable format could consist for example in converting to the STL format. The STL format (standard tessellation language) represents a standard interface of many CAD systems and is designated to provide geometric information of three-dimensional data models for manufacturing. However, other types of machine-readable formats are also possible.

In accordance with step c), the beam-shaping elements are produced with the aid of a three-dimensional direct-writing lithography method in situ at the target position. The expression "three-dimensional direct-writing lithography method" used here designates a microstructuring method with which it is possible to structure or deposit one or more materials in an additive or subtractive manner in accordance with a specified three-dimensional pattern or layout. It is possible hereby to produce three-dimensional structures with an accuracy of preferably better than 1000 nm, with particular preference better than 500 nm, and with very particular preference better than 100 nm, wherein the term "three-dimensional" designates a possible shaping of the structures in one, two or three spatial directions. The resolution of the three-dimensional direct-writing lithography method can here preferably be better than 10 µm, particularly preferably better than 2 µm, and with particular preference better than 1 µm, with the term "resolution" here referring to the largest extent of the smallest structure element that is producible with the method. The three-dimensional direct-writing lithography method can preferably be designed such that it can be performed under normal atmospheric environment conditions, without a vacuum being necessary. In particular, additive or subtractive three-dimensional direct-writing lithography methods are suitable which permit the deposit or removal of materials at a rate of preferably more than 50 µm$^3$/s, with greater preference of more than 500 µm$^3$/s, with very particular preference of more than 1000 µm$^3$/s, and with the highest preference of more than 10 000 µm$^3$/s. In a particularly preferred configuration, the three-dimensional direct-writing lithography method can be selected from a direct-writing lithography method and two-photon lithography.

The term "in situ" here describes a procedure which is characterized in that the beam-shaping elements are produced directly at the intended target position, in particular directly at a structural element facet or holding structures located at one of the optical components. In this way, the beam-shaping element thus produced can preferably directly adjoin the associated optical component and can therefore be directly connected to the optical component or be arranged in a direct environment of the optical component. As will be explained in more detail below, the beam-shaping element to this end can comprise a material which is able to be structured by way of illumination. The present method thus differs from processes known from the prior art, in which one or more beam-shaping elements are produced at a location outside the target position and are only then inserted at the desired target position. However, a disadvantage of these processes is in particular that very high requirements must be applied in an associated assembly process with respect to the positioning of the previously produced beam-shaping elements, with the result that generally active positioning methods are necessary.

When using two-photon lithography, absorption of two photons is brought about in the focal point (focus) of a pulsed laser of high peak intensity, which effects a chemical change in a photochemically structurable material typically referred to as photoresist (resist). By exposing the desired structure to light, the desired structure can thus be cured. A non-exposed proportion of the photoresist can be removed in a further step, also referred to as the developing step, in particular by flushing away the non-exposed material, with the result that only the desired, exposed structure remains. The method can also be configured such that only the exposed structure is dissolved and the remainder is maintained in a subsequent developing step, with a suitable resist material being used herefor. Structures of any desired form can be produced using the described production method. In particular it is possible to produce structures which are designated to influence (modify) the mode field diameter of light beams in practically any desired way, and which are here referred to as beam-shaping elements.

In a preferred configuration based on direct-writing laser lithography, the beam-shaping element to be produced could first be divided into planes there, wherein the planes can be arranged preferably at a distance of 20 nm to 500 nm, with particular preference from 40 nm to 200 nm, in particular from 50 nm to 150 nm, with respect to one another. The planes can in particular be written by lines which have a distance of preferably 20 nm to 500 nm, with particular preference 40 nm to 200 nm, in particular 50 nm to 150 nm. Ends and beginnings of the lines can be described in a data set by Cartesian coordinates. Other methods of representation are possible, however, such as on the basis of cylindrical coordinate systems. A three-dimensional direct-writing laser lithography system can scan the corresponding lines and in this way produce a three-dimensional structure. Alternatively it is possible to use writing strategies which are adapted to the form of the optical components and in which for example writing lines are guided preferably in a manner parallel with respect to the surface to prevent the formation of step-type structures on the surface of the beam-shaping element.

In a particularly preferred configuration, the beam-shaping element can have a homogeneous embodiment and thus comprise only a single element made of a single material, which is in direct contact with the optical component or an additional holding structure (described in more detail below) and can be fixedly connected thereto. It is thus possible to dispense with the use of a bonding means, in particular an adhesive, to connect separately produced or provided elements to one another. In this way, the production method for optical systems can be further simplified with respect to the use of processes known from the prior art.

Step c) can in particular be performed as follows using a direct-writing laser lithography method:

(α) Assembling the optical components in the lithography system and measuring their position relative to the coordinate system of the lithography system. To this end, in particular alignment marks can be used on the chip surface, which were produced together with the optical components located on the chip and can therefore be aligned precisely with respect to the optical components. Typically already present structures which fulfill a further purpose, such as a waveguide that is to be optically connected or a coupling structure, can here also serve as alignment marks. Capturing the alignment marks can be effected for example using a camera-based method or another imaging method. For capturing the alignment marks in three positions, it is for example also possible to use confocal imaging methods. It is in particular possible to use parts of the optical beam path of the lithography system both for capturing the alignment marks and for exposing the beam-shaping elements to be produced to light.

(β) Production of the beam-shaping elements designed in step b) in the local coordinate system of the optical components: The beam-shaping elements are here fixedly connected to the respective associated optical elements. The positioning accuracy with which the beam-shaping components can be realized on the optical components can here be preferably better than 500 nm, with particular preference better than 200 nm, and in particular better than 100 nm. To obtain this positioning accuracy, alignment marks can be used which are applied on the optical components and the relative position of which with respect to the waveguide facets of the optical components is very well known, with the accuracy preferably being better than 300 nm, with particular preference better than 150 nm, in particular better than 70 nm. These alignment marks can be captured during the lithography step with a high degree of accuracy, with deviations having an accuracy preferably less than 500 nm, with particular preference less than 200 nm, in particular less than 100 nm. The beam-shaping elements can be produced directly at or on the optical components. Alternatively, the beam-shaping elements can also be produced at or on a holder, which can be fixedly connected to the optical components. In particular, the holder can also be a structure produced using a structuring method for two-dimensional structures, in particular two-photon lithography. The holder can be produced in the same method step as the production of the beam-shaping elements.

The configuration of step c) can optionally provide for a preparation of the optical components to be connected, which includes for example a suitable surface modification by way of an adhesion promoter or application of holders having an anchoring effect.

In an optional configuration, it is possible here for at least one of the optical components to have a holding structure, in particular a holding structure in the form of a spacer, which is preferably designated in the form of a solid base plate, of a surface coating, and/or of a functionalization of the surface. Alternatively or additionally, the holding structure can also be produced by way of a lithographic method, which can preferably be performed in the same method step that also comprises the production of the beam-shaping element. The use of the spacer and/or of beam-shaping elements which can directly have a holding structure can be advantageous in particular in order to spatially separate the beam-shaping elements from the at least one optical component, as a result of which damage to the optical component caused during writing of the beam-shaping elements using the lithography beam can be avoided. In addition it is possible hereby to largely prevent interactions between the optical component and a lithography laser beam, which could lead to an adverse effect on the results from the lithography, for example by shadowing or micro-explosions in the vicinity of metallic structural elements. Furthermore, the intensity that is incident on the beam-shaping element reduces as the distance of the element from the facet of the optical element increases, with the result that distancing can also result in increased stability with respect to high optical powers.

Furthermore, it is possible to apply an intermediate layer between one of the optical components and an associated beam-shaping element, wherein the intermediate layer can serve as a holding structure and/or as an adhesion promoter. Here, a reflection-reducing coating can be applied on at least one surface of the beam-shaping elements. Alternatively or additionally, it is also possible for interspaces between the beam-shaping elements to be filled at least partially with an optically transparent material, wherein the optically transparent material can in particular be designated to reduce reflection losses between the beam-shaping elements and/or to reduce a chromatic aberration of a light beam passing through the beam-shaping elements.

Generally, the preparation of the optical components can be effected by way of structuring using a lithography method, for which in particular two-photon lithography can be selected. The preparation of the optical components to be connected can also comprise steps which increase the compatibility with a subsequent production process. This can preferably be coating the optical components with materials which increase a chemical compatibility, reduce reflections, and/or promote adhesion.

Step d) makes provision for the positioning and fixing of the optical component, which is supplemented by the at least one beam-shaping element, on a common base plate at a target position intended therefor. In the above-described, particularly preferred configuration, the positioning and fixing of the optical components, which are supplemented by the two beam-shaping elements, on the common base plate at the target positions intended therefor are thus effected during step d). Separate positioning of the beam-shaping elements is consequently not necessary in accordance with the present method, because the beam-shaping elements are already at the target position in accordance with step c). The common base plate can here be configured in the form of a single base plate on which said optical elements can be positioned and fixed. Alternatively, the base plate can however also be designated as a fixed connection of a plurality of individual base plates. In particular, a further optical component or an electrical component can here also serve as the base plate for the positioning and fixing of at least the optical components.

The positioning of the optical components, which are supplemented by the beam-shaping elements, can be effected preferably such that here the beam-shaping elements used can be positioned with respect to the respectively associated optical components with an accuracy of preferably better than 5 µm, with particular preference better than 2 µm, in particular better than 1 µm.

For positioning and fixing the optical component, which is supplemented by the beam-shaping element, it is thus possible to use both passive and active methods for positioning. Preferably one of the following methods can serve here as the fixing method: adhesive bonding, ultrasound bonding, soldering, plugging, clamping, screw-connecting, optical contact bonding, cold welding, welding, laying, connecting by electrostatic and/or magnetic forces, such as by way of dispersion forces or structures imitating gecko feet. With a corresponding configuration of the beam-shaping elements, it is possible here to work preferably with tolerances of more than 500 nm, with particular preference with tolerances of more than 2 µm, in particular with tolerances of more than 5 µm. For vertical positioning of the optical components, the use of suitable, for example stepped base plates for the correct height adjustment may be advantageous, depending on the positioning technique used. Lateral positioning of the optical elements to be connected can be effected very precisely for example using a camera-based method.

In a further optional configuration, the optical components and the beam-shaping elements can be embedded in an embedding medium. The embedding medium can be for example a transparent medium which preferably cures upon exposure to ultraviolet radiation. The embedding medium can protect the optical structural elements, that is to say the optical components and the beam-shaping elements, against environment influences and/or reduce optical losses due to reflection. The subsequent embedding of the optical structural elements is preferably taken into account in the preceding steps, in particular in the above-described simulation. In particular, the beam-shaping components can also be produced in an embedding medium. A method would here be used, which either increases or lowers the refractive index of a preferably solid medium upon the action of a lithography mechanism.

The method according to this disclosure can advantageously permit cascading of a plurality of beam-shaping elements, in particular a plurality of optical surfaces. In this way, a number of degrees of freedom for the technical design of the optical connection can be increased. This can permit in particular changing a non-rotation-symmetric beam profile into a symmetric beam profile using beam-shaping elements which can be located at any desired location along the optical axis of the light beam. However, further applications of a cascade of optical surfaces are conceivable.

In a further configuration, it is possible using 3D freeform optics with typically a plurality of optical surfaces to prevent back-reflections into light-emitting structural elements such as lasers or SLEDs, for example by appropriately inclining reflective surfaces of the beam-shaping elements.

One effect which may result from the expansion and collimation of the light beam is the lowering of the requirements in terms of the positioning accuracy in the axial direction of the propagating light beam. The tolerable position deviations in the axial direction for an appropriately collimated light beam are greater by orders of magnitudes than the positioning tolerances transversely to the light beam.

By increasing and collimating the beam profile between different optical structural elements, it is furthermore possible for a beam to be produced which can propagate over relatively long sections with an expansion which is relatively low with respect to the beam diameter. In a particular configuration, it is possible hereby to effect introduction of additional optical structural elements within the coupling section. The additional optical structural elements can preferably be components that are only difficult to produce on optical chips, in particular optical thin-film filters, polarizers, beam splitters, waveplates, or non-reciprocal structural elements such as Faraday rotators or isolators.

By expanding the beam profile it is possible to lower the requirements with respect to the positioning accuracy of the structural elements, but at the same time generally the requirements with respect to the accuracy with which the orientation of the structural elements with respect to one another is adjusted increase. This can be illustrated in a simple example of a Gaussian beam by way of the dependence of the waist diameter on the divergence angle. A reduced sensitivity with respect to translational positioning errors can often only be achieved at the cost of an increased sensitivity with respect to rotational errors when adjusting the structural elements. In a particular embodiment of the method, this conflict of objectives is taken into account when designing the beam-shaping elements, and thus an optimum balance between translational and rotational accuracy requirements is achieved.

By embedding one or more optical structural elements in an optically dense medium, a reduction in the beam divergence inside the medium as compared to the propagation in free space can be brought about. This effect is similar to that of an immersion microscope, which achieves a greater resolution using an immersion medium which embeds the sample and has a refractive index greater than 1. The immersion medium can be liquid or solid. In a further configuration of this disclosure, this effect can be used in that the beam-shaping element directly adjoins the facet of an optical component. This configuration is desirable in particular in optical structural elements which inherently emit with a great divergence such that collimation using a beam-shaping element located at a distance from the facet is possible only with difficulty or is not possible due to an optical critical angle. This is the case for example in the case of the optical coupling to the front face of a silicon-on-isolator nanowaveguide, which, at a wavelength of 1.55 μm, frequently has mode field diameters of an order of magnitude of approx. 1 μm and thus have correspondingly large divergence angles.

The described expansion and collimation of the light beam does lower the requirements with respect to the relative positioning accuracy between the optical components, which are supplemented by the beam-shaping elements, but in return requires very precise positioning of the beam-shaping elements relative to the respectively associated optical component. However, due to the described high adjustment accuracy of freeform optics produced in situ, preferably using two-photon lithography, this situation does not pose a problem. The production of beam-shaping elements using two-photon lithography permits a very precise adjustment of 3D freeform optics with respect to existing optical components with an adjustment accuracy of significantly under 100 nm. Typically, the lithography system can be provided with a confocal scanning unit, which can use the laser for the lithography at the same time also as a light source for capturing alignment marks on the optical components. If a systematic error in the illumination optics is present, it can be assumed that said error will have the same effect on the position measurement of the optical components as on the structuring of the beam-shaping elements. Systematic errors in the position measurement are therefore compensated, which further increases the positioning accuracy. If a camera is used to measure the position, largely the same optical path as for the lithography is also used, which means that systematic deviations are at least partially compensated in this case, too.

Structuring of 3D freeform optics directly onto the optical components is associated with different problems with respect to the interaction of the light beam used for the lithography method and the respective optical component. Interaction should be understood here to mean both a mutual effect of the laser beam onto the optical components and a reverse effect, and also in only one of the two effect directions. In particular, problems can occur during the production of the beam-shaping elements on optical components having a high reflection, sharp edges and/or metallic character. Here, in the production of structures using two-photon lithography, frequently micro-explosions occur, which can manifest as defects, micro-bubble formation and/or macro-bubble formation. Depending on the surface condition, it is furthermore possible for adhesion problems to additionally occur. These effects can make reliable writing of corresponding optical structural elements more difficult or prevent it.

One possible solution for the previously mentioned problems can be an adaptation of the production parameters. The power of the lithography system in a direct vicinity of the beam-shaping element to be written can preferably be reduced if micro-explosions occur or increased if adhesion problems occur. However, such an adaptation can typically be performed in a component-specific manner and can consequently require great development complexity. Alternatively, problems due to interaction of the lithography beam with the sample can also be solved by way of the structures not being created directly on the optical components to be connected, but on a further carrier structure which is fixedly connected to the optical components. The carrier structure can in particular comprise the same material or a material having optically identical properties as the optical components or the beam-shaping elements. The carrier structure can in particular also be produced with the same method that is also used for structuring the beam-shaping elements. An exemplary configuration is a lens produced on support structures. The support structures, in particular in the form of pillars, can here be anchored such that no undesirable interaction of the lithography system with the beam-shaping element to be written occurs. Alternatively or additionally, the support structures can be anchored at a location at which an interaction with the optical component to be connected that occurs due to the writing process is not a problem. In particular, it may make sense here to prevent direct contact between the beam-shaping elements and the facets of the optical components to be connected. By producing beam-shaping elements at a distance from the optical components, the mode field can expand due to the propagation in space, which means that the associated power density decreases. It is possible hereby to also couple laser beams with great power.

During the operation of an optical coupling section, spatially inhomogeneous temperature changes may occur, as a result of which the beam-shaping elements can be slightly deformed, as a result of which an angle deviation with respect to the original structure can occur. As a result, a decrease in the coupling efficiency due to a deflection of the light beam on a deflected path as compared to the original path may occur. As a result of a corresponding arrangement of beam-shaping elements, this deviation can also be compensated, with the result that an incident beam leaves the optical system again independently of the temperature-related deviations.

Due to a large number of beam-shaping elements, furthermore the problem of an occurrence of great reflection losses can arise. In a particular configuration, these can be reduced by embedding the beam-shaping elements in a surrounding material, because in this way the refractive index contrast, i.e., a difference of the refractive index with which the beam-shaping elements were produced with respect to the refractive index of the surrounding material, can be reduced.

Generally speaking, reflection losses in optical media substantially depend on the number of the optical interfaces and on the refractive index difference (index contrast) between the materials forming a respective interface. It can be shown that an optical system having many optical interfaces and a low index contrast has fewer losses than a system which is equivalent with respect to the optical refractive power and has a high index contrast and few interfaces. This can for example be illustrated by the following consideration: As a simplified assumption, it can first be assumed that the reflection of rays that are incident on a surface is approximately that of rays with normal incidence. This is approximately justified for lenses to which light is applied substantially in the internal region of their cross-sectional area. According to the Fresnel equations, for the reflection R at completely transparent surfaces $$R = \frac{(n - n_0')^2}{(n + n_0')^2} \quad (1)$$

wherein n is the refractive index of the lenses and $n'_0$ is that of the surrounding medium. It is furthermore assumed that what is referred to as the "lensmaker's equation" applies:

$$f = r \frac{n}{n - n_0'}, \quad (2)$$

wherein f is the focal length and r is the radius of curvature of a spheric lens surface. The reflection is furthermore to be considered equal to loss. In particular in the limit case of small reflection losses, the total loss $R_{total}$ of a cascade of k surfaces which are equivalent with respect to the power reflection is k times the reflection losses of an individual surface:

$$R_{total} = kR. \quad (3)$$

Starting from the assumption that all interfaces of the cascade have the same focal length f, the focal length $f_{total}$ of the total system is obtained by reciprocal addition of the individual focal lengths, $$f_{total} = \frac{1}{\sum_i \frac{1}{f}} = \frac{f}{k}. \quad (4)$$

An interface having a high index contrast and correspondingly small focal length can thus be replaced by a cascade of interfaces having a low index contrast and individually large focal length.

In the further consideration, while maintaining the form of the interfaces, the refractive index $n'_0$ of the surrounding medium is varied between the refractive index of air $n_0=1$ and the refractive index n of the lens material, and at the same time the number of the interfaces is adapted such that the focal length $f_{total}$ of the total system is maintained, i.e., the loss of refractive power due to a diminishing refractive index contrast is compensated by a greater number of optical interfaces. Using the lensmaker's equation and the reciprocal additivity of the focal lengths, for the number of necessary surfaces $$k = \frac{r \frac{n}{n - n_0'}}{r \frac{n}{n - n_0}} = \frac{n - n_0}{n - n_0'}. \quad (5)$$

It is possible on this basis to estimate the total loss of the thus produced system as follows:

$$R_{total} = kR = \frac{n - n_0(n - n_0')^2}{n - n_0'(n + n_0')^2}. \quad (6)$$

Consequently, this nearly gives a decrease in total loss with the refractive index difference $n-n'_0$ between lens material and surrounding medium. The number of the necessary surfaces increases by contrast. It is possible in principle hereby to minimize losses as desired, but with a very large number of optical interfaces. In summary, the result of the analysis is that an optical system having few interfaces and a high index difference can be replaced by an equivalent optical system having a greater number of interfaces with a lower index difference. With respect to the configuration of the beam-shaping elements, it is possible for minimizing the reflection losses to select a number of optical surfaces that preferably ranges from 2 to 100, with particular preference from 4 to 50, in particular from 6 to 12.

The variation of the refractive index contrast of the lens surfaces opens up new degrees of freedom in designing the optical coupling section. In particular, for a lower index contrast, the curvature of the lens surfaces could be increased at the same time, because scatter losses for rays with grazing incidence in the case of a weak index contrast will be lower and additionally total internal reflection upon traversing of an interface from an optically less dense to an optically dense medium is less problematic.

In a further configuration, the surrounding medium can also have a higher refractive index than the material of the beam-shaping element. This situation can preferably be taken into account in the design of the beam-shaping elements and manifests, e.g., in a corresponding reversal of the direction of curvature of refractive surfaces. For example, a concave lens structure embedded in a high-refractive surrounding material can exhibit a focusing effect.

For the production of the described system with a low refractive index contrast, the above-described three-dimensional direct-writing lithography method, in particular two-photon lithography, can be used with a subsequent embedding step. Here, in particular different embedding materials can also be used. These can also take on additional functions, in particular decreasing of the chromatic aberration. Furthermore, it is possible in the embedding step to also leave cavities. The cavities can be filled with another desired medium or left unfilled. To produce the beam-shaping elements, it is also possible to use a material having a refractive index that can change as a result of exposure to light, in particular an ORMOCER®, a glass or a polymer.

In a further configuration, surrounding medium having the same refractive index as the beam-shaping elements used can be applied, in particular if the contact surfaces traversed by the light beam between the surrounding medium and the beam-shaping elements have no relevant optical function.

In a further configuration, the method according to this disclosure can permit the production of beam-shaping elements that can have internal cavities filled with air or another low-refractive medium. The surfaces of these cavities can be used as beam-shaping interfaces having a refractive power that is not influenced by an external embedding medium. This method can make it possible in particular to produce compact elements of high refractive power, even if external embedding in a medium, which may have merely a low index contrast with respect to the material of the beam-shaping element, may turn out to be necessary for other reasons.

In a further configuration, antireflective coatings can be used to additionally lower reflection losses.

In a further configuration, it is possible to use, instead of refractive optical elements, mirroring optical elements or reflective optical elements, in particular to additionally decrease the reflection losses. It is possible here to use total internal reflection at transitions of media having low index contrast and high index contrast.

In a further configuration, the beam-shaping elements can be produced such that they are first produced at a multiplicity of contiguous optical components before a singulation step for singulating the optical components for the respective further use in one or more optical systems is performed. For example, beam-shaping elements can be produced on surface-emitting structural elements with particular efficiency as long as the structural elements are still present in the form of a wafer, which is split into individual elements only after the writing of the beam-shaping elements.

In a further aspect, this disclosure relates to an optical system, in particular an optical system produced according to a method according to this disclosure. The optical system comprises at least two separate optical components, with each of the optical components having a beam profile. The two optical components are fixedly connected to at least one beam-shaping element such that an optical component that is supplemented by the beam-shaping element is obtained, wherein the beam-shaping element is obtainable in situ using a three-dimensional direct-writing lithography method. The beam-shaping element is here designated to change the beam profile of the optical components such that an optical coupling between the optical components occurs, wherein the optical component, which is supplemented by the beam-shaping element, is positioned on and fixed to a common base plate.

The present optical system thus differs in particular from optical arrangements known from the prior art in that the beam-shaping elements are produced in situ at the target position, preferably directly at a structural element facet or at corresponding holding structures of one of the optical components, by way of a three-dimensional direct-writing lithography method and in that the beam-shaping elements can be deliberately used to improve the coupling efficiency between two optical components and to increase the associated positioning tolerances. In particular, the beam-shaping elements are here produced in situ at the target position in accordance with step c) of the method described here.

In a preferred configuration, each of the two optical components can have a dedicated beam-shaping element, with the result that the optical system comprises two optical components, which are supplemented each by a beam-shaping element. However, optical systems in which the two optical components share a common beam-shaping element obtainable in situ at the target position using a three-dimensional direct-writing lithography method are also conceivable.

In a particularly preferred configuration, the beam-shaping elements are here designated each in terms of shape and positioning such that the optical coupling between the optical components has at least one defined coupling efficiency at a selected positioning accuracy.

In particular, each of the optical components is selected from the group comprising single-mode fibers or multi-mode fibers made of organic or inorganic materials, semiconductor-based integrated optical chips such as lasers, photodiodes, superluminescent diodes, or silicon photonics chips, integrated optical chips on the basis of other semiconductors or dielectric materials such as glasses, silicon dioxide, silicon nitride, or polymers, optical printed circuit boards, or elements for free beam optics such as lenses, beam splitters, isolators, mirrors or diffraction gratings. The optical components can have optical waveguides with a low index contrast (for example glass-based optical waveguides) or with a medium or high index contrast (for example semiconductor-based waveguides). Input coupling and output coupling of light can be performed at the edge of an optical component, for example at the chip edge in edge-emitting lasers or waveguide-based systems having corresponding facets, or on the upper surface, for example in surface-emitting lasers (vertical cavity surface emitting lasers, VCSEL), in surface-illuminated photodiodes, or in waveguide-based chips with corresponding coupling structures (e.g., grating couplers, deflection mirrors).

In one possible configuration, the optical connection of the two optical components has at least two beam-shaping elements, wherein at least one beam-shaping element is designated to increase the local beam divergence, while at least one further beam-shaping element is designated to reduce the local beam divergence. In particular, at least one of the beam-shaping elements can to this end be designated in the form of a beam expander, wherein the beam expander has a structure which is selected from a reflective structure, a light-guiding structure or a diffractive structure.

In a particular configuration, each of the optical components has a plurality of optical coupling locations, wherein each of the optical coupling locations is fixedly connected to at least one beam-shaping element, wherein the beam-shaping elements are designated each to form a preferably simultaneous optical coupling between the optical components over all optical coupling locations.

In a preferred configuration, one of the optical components can be designated as an optical chip. The term "optical chip," which is used in particular in the field of integrated optics, here designates a planar substrate on which one or more optical components are located which are typically producible using a microstructuring method. An optical chip can have for example one or more photodetectors, light sources, waveguides, passive structural elements such as filters or power splitters, electrooptical modulators or combinations thereof. Further configurations are conceivable, in particular also the combination of photonic and electronic structural elements on a common chip.

The beam-shaping elements attached to the optical chip can be designated such that they can effect a deflection of light propagating in the chip plane into a direction that is oriented substantially perpendicularly to the surface of the chip and/or can deflect light from a direction that is oriented substantially perpendicularly to the surface of the chip into a propagation direction located in the chip plane. The term "substantially perpendicularly" here denotes an angle of at least 50°, preferably at least 60°, in particular approximately 90°, relative to the surface of the optical chip. Here, the light propagating in a direction that is oriented substantially perpendicularly to the surface of the optical chips can pass through another further optical chip or through an optically transparent window placed in the optical chip and/or the further optical chip. Alternatively or additionally, the light propagating in a direction that is oriented substantially perpendicularly to the surface of the optical chip can be coupled into the further optical chip, wherein the beam-shaping elements attached on the further optical chip can be designated such that they can deflect light from a direction that is oriented substantially perpendicularly to the surface of the chip into a propagation direction located in the chip plane. In this configuration, the light propagating in a direction that is oriented substantially perpendicularly to the surface of the optical chip can preferably be coupled into one or more optical components which are designed as a waveguide array, wherein the beam-shaping elements attached on the relevant optical component can be designated such that they can deflect light from a direction that is oriented substantially perpendicularly to the surface of the chip into a propagation direction located in the chip plane. In a possible configuration, at least one of the beam-shaping elements can comprise a waveguide, an expanding part and a part that reduces the divergence of the exiting beam.

For further details with respect to the present optical system, reference is made to the description of the method according to this disclosure.

This disclosure has a number of advantages with respect to the method and optical systems known from the prior art. The present method permits the optical interconnection of optical components, which may have the same or different mode field diameters, in a robust and automated assembly process with as little coupling losses as possible. The optical connection is possible here in particular also for broadband light, that is to say for light having different wavelengths. The assembly process has relatively low requirements with respect to the positioning accuracies. For example, the tolerances for translational positioning accuracies are preferably more than 500 nm, with particular preference tolerances of more than 2 µm, and with very particular preference of more than 5 µm or even 10 µm. The number of the mechanical degrees of freedom during the assembly process can be kept low because the beam-shaping elements are adjusted with great precision with respect to the facets of the optical components to be connected and are fixedly connected thereto. The method can be embodied to be automatable and can be used for a large number of laterally single-mode or multi-mode systems. In particular, optical components with non-rotation-symmetric mode field profiles, such as semiconductor lasers, superluminescent diodes (SLEDs) or integrated optical waveguides, can also be coupled. It is furthermore possible to avoid back-reflections, in particular when connecting lasers and SLEDs. The coupling losses can be kept low, preferably below 2 dB, with particular preference below 1 dB, in particular less than 0.5 dB. It is additionally possible to be able to deflect the light emitted by an optical component within a beam-shaping element by a specific angle, with the result that, for example, optical components which emit in mutually orthogonal directions can also be connected to one another.

The production of the beam-shaping elements in situ according to this disclosure at or on the optical components to be connected has in particular the advantages which will be mentioned below. In this context it is possible for increasing the precision during setup of the system to use marks on the chip surface which were produced together with the optical structures on the chip and therefore have a very high relative positioning accuracy with respect thereto. It is furthermore possible to couple light over the surface of an optical chip into an optical waveguide extending in the chip plane with little loss and in a broadband manner. It is here in particular also possible for an optical connection between stacked chips to be effected. In addition, the distance between optical components can be variable, which means that both small structural sizes and correspondingly short coupling sections and also large-area systems with long coupling sections become possible. It is in particular possible to also be able to couple optical components with a non-rotation-symmetric mode field profile to components with a rotation-symmetric mode field profile. It is furthermore possible to minimize back-reflections, in particular when optically connecting lasers and superluminescent diodes (SLEDs). This is important to the extent that otherwise black-coupling of the light emitted by a laser or an SLED into the structural element occurs, which can result in a disturbance of the operational behavior. It is additionally possible to also be able to deflect the light emitted by an optical component by a specific angle, with the result that, for example, optical components which emit in directions that are not collinear with respect to one another can also be optically connected to one another. It is furthermore possible to compensate manufacturing-related inaccuracies during the production of optical components during the assembly of the system, with the result that it becomes possible for example to couple components with waveguide arrays to one another despite unavoidable variations in terms of the distance between adjacent waveguides. The method furthermore makes it possible to interconnect or separate components with reproducible coupling losses, as is the case for example in plug systems. The method is furthermore scalable and consequently also usable in an automated manner for a large number of components. It is additionally possible to combine the method flexibly with further steps for setting up optical systems, with the result that steps for electrical wiring of structural elements can for example be integrated in the manufacturing processes. Here, there is in particular the possibility of designing the method such that the optical system, which has been partially or completely assembled, is not exposed to any wet-chemical treatment steps such as processing in a developing bath.

Due to the high precision of the production methods used and to the possibility of already adjusting the beam-shaping elements directly with respect to marks on the optical components during the production, an inherent great positioning accuracy of the beam-shaping elements relative to the optical components to be connected is attained. This is the case in particular if the same optical system is used for measuring the position of the optical components as is used for performing the lithography. Consequently, the present method is suitable in particular also for single-mode structural elements with small mode field diameters. By using a three-dimensional direct-writing lithography method, it is additionally possible to produce beam-shaping elements with nearly any desired shapes, such that the present method is suitable for a wide range of uses. Furthermore, structural-element-specific deviations caused for example by manufacturing tolerances can be compensated, with the result that optical structural elements, in particular lasers, having relatively high manufacturing tolerances can also be used. It is additionally possible to produce even small quantities in a cost-efficient manner, because application-specific beam-shaping elements are producible with little outlay. Furthermore, the facets of the optical components to be connected can be embedded directly in the material of the beam-shaping elements which has a high refractive index as compared to air, which has the advantage that it is possible to couple even very small mode fields with high divergence, because the divergence decreases as the refractive index of the surrounding medium increases. The requirements in terms of the positioning accuracy of the optical components with respect to position and rotation can be adapted in dependence on the available positioning and fixing technology, and consequently the conflict of objectives between the greatest possible rotational and translational positioning tolerances can be resolved in an optimum manner. Using suitable holding structures, the beam-shaping elements can be produced such that they are preferably located at locations of lower power density, which can increase in particular their service life and stability with respect to high optical powers. In addition, it is possible in the method according to this disclosure to flexibly set the refractive index difference at the surfaces of the beam-shaping elements by embedding them in a surrounding material having a suitable refractive index. This opens up additional degrees of freedom in the design of the optical coupling section and permits in particular cascading of a multiplicity of elements with low index contrast and correspondingly individually low refractive power, whereby back-reflections and reflection losses along the beam path can be greatly reduced. Moreover, with a corresponding design of the beam-shaping elements, it is also possible to effect changes in direction, for example by 90°, of the light beam to be coupled. Finally, optical systems can be produced which are embodied to correct any deviations of the beam-shaping elements from their original intended shape.

In particular, the use of beam-shaping elements which have both an expanding part and a collimating part has the following advantages. The requirements in terms of the positioning accuracy can hereby be lowered further. The use of an expanding part and of a collimating part can provide additional degrees of freedom for influencing a light beam. Preferably, a plurality of lenses can be used to change a non-rotation-symmetric beam profile of a laser into a rotation-symmetric beam profile, wherein the beam-shaping components can be located at any desired distance from the optical component having the non-rotation-symmetric beam profile. The additional degrees of freedom additionally permit the production of optical systems largely without back-reflection.

A significant advantage of the present method relates to its universal applicability. Using a three-dimensional direct-writing lithography method, it becomes possible to produce beam-shaping elements with nearly any desired shapes. It is consequently possible to realize beam-shaping elements for a wide range of system concepts.

This disclosure has a number of advantages even regarding process compatibility. These advantages arise in particular due to the possibility of separating the positioning of the optical components to be connected from the structuring of the associated beam-shaping elements. Structuring using two-photon lithography requires a number of method steps which are performed on optically easily accessible structural elements or which require the treatment with special chemicals, which means that they should preferably be effected as early as possible in the process flow. This disclosure permits the use of two-photon lithography early in the process flow, because no mechanical connection between the optical components is established hereby. Consequently, the optical components can also be moved and positioned after the structuring using two-photon lithography. For example, according to the prior art disclosed in the approach U.S. Pat. No. 8,903,205 B2, for example all optical structural elements are first positioned, and subsequently interconnected by optical waveguides produced using two-photon lithography. Here, the problem arises that the location to be written is frequently not accessible, because for example a housing is in the way. Furthermore, the optical structural element itself can also block the writing of a further optical structural element because the optically active side may not be accessible, such as in the case of flip chip bonding. By contrast, the present method permits structuring of the beam-shaping elements before they are positioned at their final position. Consequently, arrangements of stacked chips which are optically interconnected also become possible. In this context, corresponding cutouts may be provided in the chips, through which the light beams travel.

Similarly, configurations are possible in which beam-shaping elements attached to the surface of integrated optical chips result in light emission perpendicular to the surface of the chip and consequently make possible coupling into an array of waveguides which are possibly likewise connected to beam-shaping elements. In this configuration, it is in particular possible to design the beam-shaping elements attached to the chip such that they deflect light propagating in a planar waveguide on the chip into a direction that is oriented substantially perpendicularly to the chip surface. Such configurations are suitable for example for network switches, in which a multiplicity of optical transmitter and receiver components are attached to a powerful electrical chip or an electrical printed circuit board. A network switch in this context is understood to mean an optical system that is capable of receiving optical signals at a multiplicity of inputs and transmitting them in a modified or non-modified form via a multiplicity of outputs. It is irrelevant here whether or not optoelectronic conversions or electronic signal processing steps are performed in said switch.

Using the present method, it is furthermore also possible to first produce optical structural elements using two-photon lithography and to subsequently place them in a housing, in which they would be inaccessible for any direct writing using the lithography method. Due to the separation of structuring the beam-shaping elements and positioning the optical components to be connected according to this disclosure, a number of method-relevant advantages arise. If the beam-shaping elements were to be produced only after assembly of the optical system, it would be necessary to subject the entire system to a developing process. The chemicals required herefor, however, are frequently not usable due to a lack of chemical compatibility with constituent parts of the optical system, which means such a process is not able to be performed. However, if the structuring of the beam-shaping elements is performed in contrast before the assembly of the associated optical components, these problems no longer exist. Furthermore, greater automation of the production process can be made possible in this way. In particular, a large number of the optical components to be written with beam-shaping elements can initially be temporarily fixed and then be written in a single completely automated process, before they are singulated for integration into the optical system. In particular, it becomes possible hereby to provide optical components with beam-shaping elements already on the wafer plane and before singulation.

A further substantial advantage of this disclosure is adaptation of the necessary adjustment accuracy to the available positioning technology. For positioning optical structural elements, typically a very high degree of positioning accuracy is necessary. This positioning requirement can only be ensured using costly special machines that ensure positioning accuracy of under 1 µm. Furthermore, active alignment is frequently necessary, which causes great outlay and consequently high expense. Due to the expansion of the mode field according to this disclosure, a misalignment of the optical components to be connected, however, has a significantly lower effect on the coupling efficiency thereof. It is thus possible to use more cost-effective machines with lower positioning accuracy. Furthermore, active alignment is no longer required. As compared to conventional methods in which additional microlenses for beam shaping are positioned and fixed during the assembly process, the number of positioning steps and the thus associated degrees of freedom that are to be taken into account during the alignment is reduced. Additionally, fixing of the optical structural elements on the structural-element carrier, in which a shrinkage of adhesives can frequently result in position deviations, is simplified.

A further considerable advantage of this disclosure is the provision of low coupling losses between the optical components which are coupled according to this disclosure. This is due first to a significantly greater freedom with respect to the shape of the beam-shaping elements as compared to the prior art and also to lower reflection losses in the case of a large number of successive optical elements in the beam path. For example, the coupling losses at a transition from a medium having a typical refractive index of 1.52 to air, which has a refractive index of 1, are approximately 4%, that is to say −0.18 dB. In an exemplary arrangement based on refractive beam expanders with a first microlens for collimation and a second microlens for focusing the beam, a theoretical total loss of 23%, i.e. −1.13 dB, occurs, as shown in FIG. 5, at for example six surfaces between the lens material and the surrounding air for the connection of two optical components. In practice, it is not possible to fall significantly below this limit, because most surfaces are not accessible, or accessible only with difficulty, for antireflective coatings. While it is possible to dispense with a concave, expanding lens, this frequently results in components which are too extended and are not practical for production. However, it becomes possible with the method according to this disclosure to realize a beam-shaping element which, as is illustrated in FIG. 6, has a multiplicity of for example 18 surfaces with a substantially lower refractive index difference. If a refractive index of 1.52, for example, for the material of the beam-shaping element and a refractive index of 1.47 for the filling material surrounding said element are assumed, a theoretical total loss due to reflection is merely 0.5%, that is to say 0.02 dB.

A further advantage of this disclosure relates to an adaptation of non-rotation-symmetric mode fields. It becomes possible in particular using a single beam-shaping freeform element to change a non-rotation-symmetric beam profile to a rotation-symmetric beam profile. In addition, the use of corresponding freeform elements creates a very great flexibility with respect to the placement of the beam-shaping elements along the beam path.

A further advantage is that manufacturing-related tolerances of structural elements, for example in the case of splitting of lasers, can be compensated by way of a suitable freeform structure. For example, length variations of optical components can be compensated entirely or partially by corresponding adapted beam-shaping elements. Exemplary embodiments of this can be gathered below in the figures and the associated description.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein:

FIGS. 1a and 1b show a schematic illustration of an exemplary embodiment, FIG. 1a showing a first optical component connected to a first beam-shaping element, and FIG. 1b showing a second optical component connected to a second beam-shaping element;

FIG. 2 shows a schematic illustration of an exemplary embodiment of an optical system composed of two optically coupled optical components supplemented by beam-shaping elements;

FIGS. 3a and 3b show a schematic illustration of a further exemplary embodiment, FIG. 3a showing the first optical component connected to the first beam-shaping element, and FIG. 3b showing the second optical component connected to the second beam-shaping element;

FIG. 4 shows a further exemplary embodiment of an optical system comprising two optically coupled optical components, for example single-mode fibers;

DESCRIPTION

Figure 5:
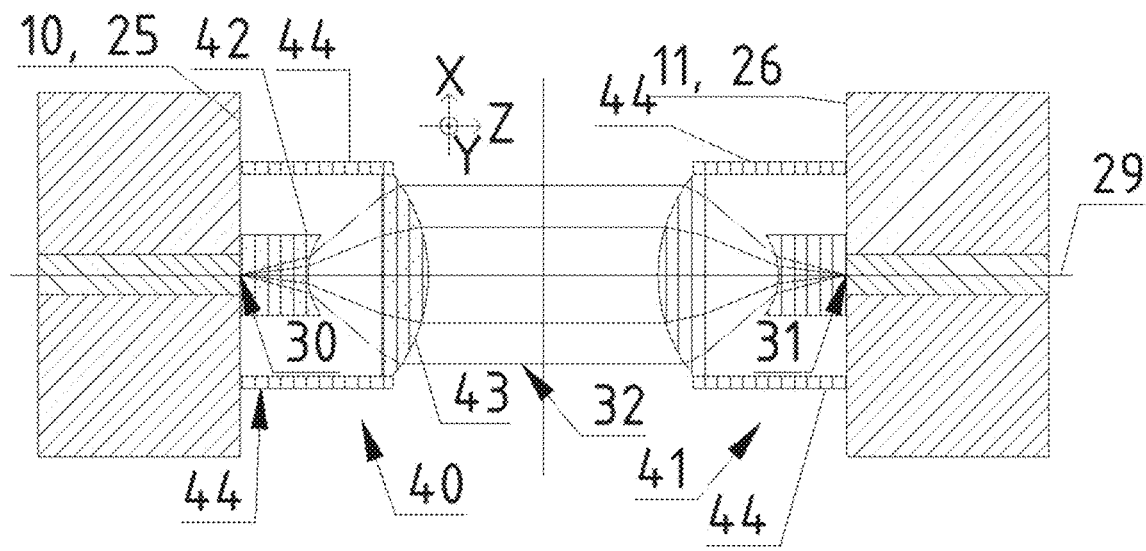
FIG. 5 shows a further exemplary embodiment of an optical system for optically coupling two optical components, for example single-mode fibers, which are each equipped with a beam expander.

The embodiments described below are not intended to be exhaustive or to limit the invention to the precise forms disclosed in the following description. Rather, the embodiments are chosen and described so that others skilled in the art may appreciate and understand the principles and practices of this disclosure.

FIGS. 1 and 2 show, by way of example, steps c) and d) of the present method for producing an optical system made up of two separate optical components 10, 11, wherein an optical coupling is formed between the first optical component 10 and the second optical component 11.

As shown in FIG. 1a), the first optical component 10 is provided for this purpose in accordance with step a). In the present exemplary embodiment, the first optical component 10 has a surface modification 12 (which will be described in more detail below) and is embodied, for example, as a light-emitting optical component. To this end, the first optical component 10 can comprise an optical fiber 20, which has a light-guiding core 21 and a cladding 22, which radially surrounds the light-guiding core 21. As a consequence of this embodiment, the first optical component 10 has a first beam profile 30, which, in the present exemplary embodiment, corresponds to the known beam profile at the output of an optical waveguide. Information relating to the first beam profile 30 and/or of the second beam profile 31 at the structural element facet can be obtained in particular using a commercial device for beam diagnostics, also referred to as "beam profiler." Alternatively or additionally, the first beam profile 30 can be determined by way of a simulation. Alternatively or additionally, the first beam profile 30 can be determined by way of manufacturer information. Other light-emitting optical components for the first optical component 10 are likewise conceivable, among them active optical components such as lasers, SLEDs or other light sources, passive optical components such as single-mode or multi-mode fibers made of organic or inorganic materials, silicon photonics chips or other integrated optical chips based on semiconductors or dielectric materials such as glasses, silicon dioxide, silicon nitride or polymers.

According to this disclosure, the first optical component 10 is provided, as per steps b) and c), with a first beam-shaping element 40, which is produced for this purpose at the location of the first optical component 10 (in situ). The first beam-shaping element 40 is here anchored to the first optical component 10 by way of the surface modification 12, which is designated to have an anchoring effect, such as an adhesion promoter, in a manner such that, as a result, a first optical component 15 which is supplemented by the first beam-shaping element 40 is obtained. In the preferred configuration illustrated in FIG. 1a), the first beam-shaping element 40 is produced and placed here on the surface modification 12 of the first light-emitting optical component 10 such that the light can be emitted from the core 21 of the light-emitting optical fiber 20 with the greatest possible efficiency. The first beam-shaping element 40 is for this purpose preferably embodied such that the beam progression has a portion 42, which expands the first beam profile 30, and also has a portion 43, in which the beam profile 32 has a collimated progression and its cross section changes only slightly. It is possible in this way, as shown schematically in FIG. 1a), for the light beam emerging from the core 21 of the light-emitting optical fiber 20 to first expand before it can be subsequently focused to form a parallel (collimated) light beam. However, other embodiments are conceivable.

Figure 27:
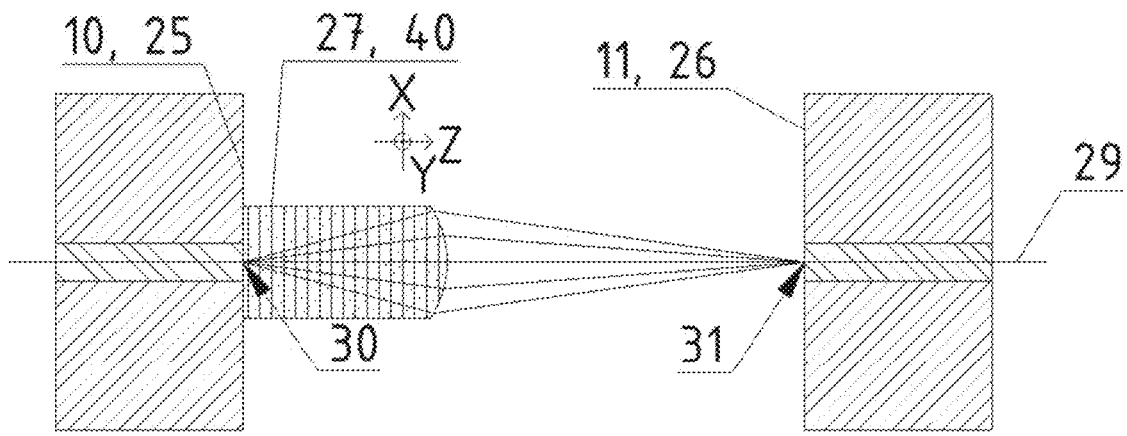
FIG. 27 shows a schematic illustration of a further exemplary embodiment with an optical connection between a first optical component connected to a first beam-shaping element and a second optical component.

Analogously, FIG. 1b) schematically illustrates the second optical component 11, which is furthermore provided as per step a) of the present method. In contrast to the first optical component 10 as per FIG. 1a), the second optical component 11 is a light-receiving optical component, which is embodied here for example as a photodiode or waveguide. As a consequence of this embodiment, the second optical component 11 has a second beam profile 31. In accordance with a particularly preferred configuration of this disclosure, the second optical component 11 in this and the following exemplary embodiments is also provided, as per step b), with a second beam-shaping element 41 produced for this purpose at the location of the second optical component 11 (in situ). Depending on the embodiment of the optical system, further configurations can also be selected, in particular a configuration having only one single beam-shaping element, as is schematically illustrated in FIG. 27. In the embodiment illustrated here, the second beam-shaping element 41 is anchored to the second optical component 11 such that in this way a second optical component 16 which is supplemented with the second beam-shaping element 41 is obtained. The second beam-shaping element 41 is produced here and placed on a surface of the second light-receiving optical component 11 such that the second optical component 11 can receive a particularly high proportion of the light that is incident thereon.

FIG. 2 illustrates schematically how, as per step c), the first beam-shaping element 40 changes the first beam profile 30 and the second beam-shaping element 41 changes the second beam profile 31 such that an optical coupling between the first optical component 10 and the second optical component 11 is formed by way of a mode field having an expanded profile 32. The optical coupling between the first optical component 10 and the second optical component 11 is preferably selected here such that the optical coupling is maximum and at the same time a positioning tolerance above the positioning accuracy of the assembly system used is ensured.

To produce the optical coupling, the optical components 15, 16, which were supplemented by the beam-shaping elements 40, 41, were, as per step c), positioned on and fixed to a common base plate 50. The base plate can here have a planar embodiment or, as is illustrated schematically in FIG. 2, have a non-planar surface, for example in the shape of one or more steps. The optical components 10, 11 are mounted on the base plate 50 with the selected positioning accuracy, wherein the positioning accuracy is the result of a sum of deviations of an actual position of the optical components 10, 11, which is ascertained after positioning on and fixing to the base plate 50, as compared to a desired target position of the optical components 10, 11.

FIG. 3a) shows a schematic illustration of a further exemplary embodiment of the first optical component 10, which is connected to the first beam-shaping element 40. As compared to the illustration in FIG. 1a), the surface modification 12 of the first light-emitting optical component 10 here has a holding structure in the form of a spacer 51, which is preferably embodied in the shape of a fixed base plate, as a surface coating, and/or a functionalization of the surface. Alternatively or additionally, the holding structure 51 can also be produced by way of a lithographic method, which can preferably be performed in the same method step that also comprises the production of the beam-shaping elements 40, 41, see FIG. 5. The use of the spacer 51 and/or of beam-shaping elements 40, 41 which directly have a holding structure 44 (see FIG. 5) can be advantageous in particular for spatially separating the beam-shaping elements 40, 41 from the optical component 10, 11. In this way, damage to the optical component 10, 11 which is caused by the lithography beam during writing of the beam-shaping elements 40, 41 can be avoided. In addition it is possible hereby to largely prevent interactions between the optical component 10, 11 and a lithography laser beam, which could lead to an adverse effect on the results from the lithography, for example by shadowing or micro-explosions in the vicinity of metallic structural elements. Furthermore, the intensity that is incident on the beam-shaping element reduces as the distance of the element from the facet of the optical element increases, with the result that distancing can also result in increased stability with respect to high optical powers.

FIG. 3b) shows a schematic illustration of a further exemplary embodiment of the second optical component 11, which is connected to the second beam-shaping element 41. In contrast to the illustration as per FIG. 1b), a light-facing surface of the light-receiving optical component is here likewise provided with the spacer 51, which in the present case takes the form of a layer.

FIG. 4 schematically shows a further exemplary embodiment of an optical system for optical coupling between a first optical component 10, which is present in the form of a first single-mode fiber (SMF) 25, and a second optical component 11, which is present in the form of a second single-mode fiber 26. To this end, two-photon lithography was used to produce a first lens 27 on the first single-mode fiber 25 and a second lens 28 on the second single-mode fiber 26, which lenses are configured to couple light from one fiber to the other with little loss. In one experiment, a coupling loss of 0.86 dB and a positioning tolerance during movement perpendicular to the optical axis 29 of 8.5 μm could be determined. The positioning tolerance can be defined in particular as the diameter of the region in which the coupling losses are less than 1 dB, with the result that the coupling efficiency is more than 85%.

In a further embodiment of the optical system as per FIG. 5, both single-mode fibers 25, 26 have dedicated beam expanders 83, which artificially enlarge the divergence of the light emerging from the structural element facets and in that way make possible a shorter design of the beam-expanding elements with a given beam diameter in the collimated portion. In a first experimental realization, the coupling loss was 1.9 dB and the 3 dB positioning tolerance perpendicular to the optical axis 29 produced a value of 17.7 μm, which was approximately twice the value as in the case of the structure as per FIG. 4.

Furthermore, the embodiment of the optical system according to FIGS. 5, 6, 8, 9 and 13 has holding structures 44, on which a lens is arranged. The holding structures 44, which are preferably present in the form of pillars, are preferably anchored at a location of the optical components 10, 11 such that either no undesired interactions of the lithography system with the optical component 10, 11 to be written occur and/or that the interactions which may occur due to the writing process remain below an influence threshold.

Figure 6:
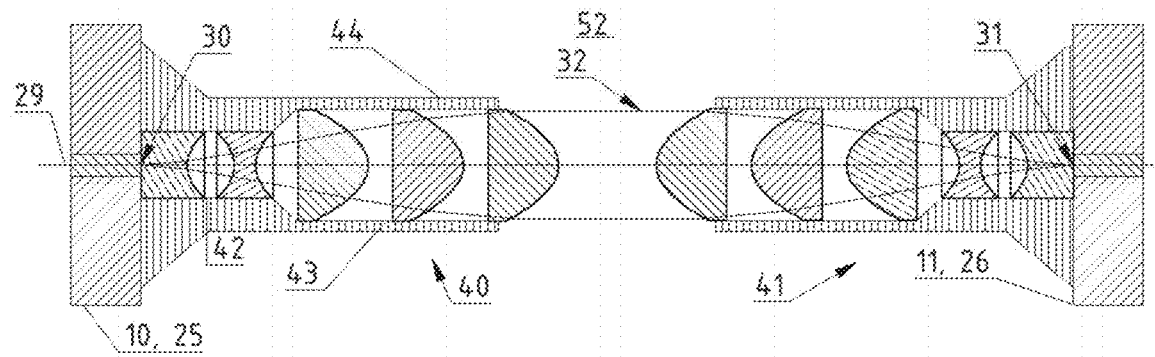
FIG. 6 shows a further exemplary embodiment of an optical system having an embedding medium.

FIG. 6 schematically illustrates a further exemplary embodiment of the optical system, in which an embedding medium 52 is used. The embedding medium 52 is adapted in particular to reduce any optical losses due to reflection and/or to protect the optical structures against environment influences. The embedding medium 52 is preferably a transparent medium, which cures for example by way of temperature or exposure to UV radiation. Embedding optical structural elements of the optical system in an embedding medium 52 can lead to more complex optical systems, as illustrated in FIG. 6. This permits the use of a large number of beam-shaping elements 40, 41 without the occurrence of large reflection losses. The embedding medium 52 can have, depending on the embodiment, a lower refractive index or higher refractive index as compared to the beam-shaping elements 40, 41.

Figure 7:
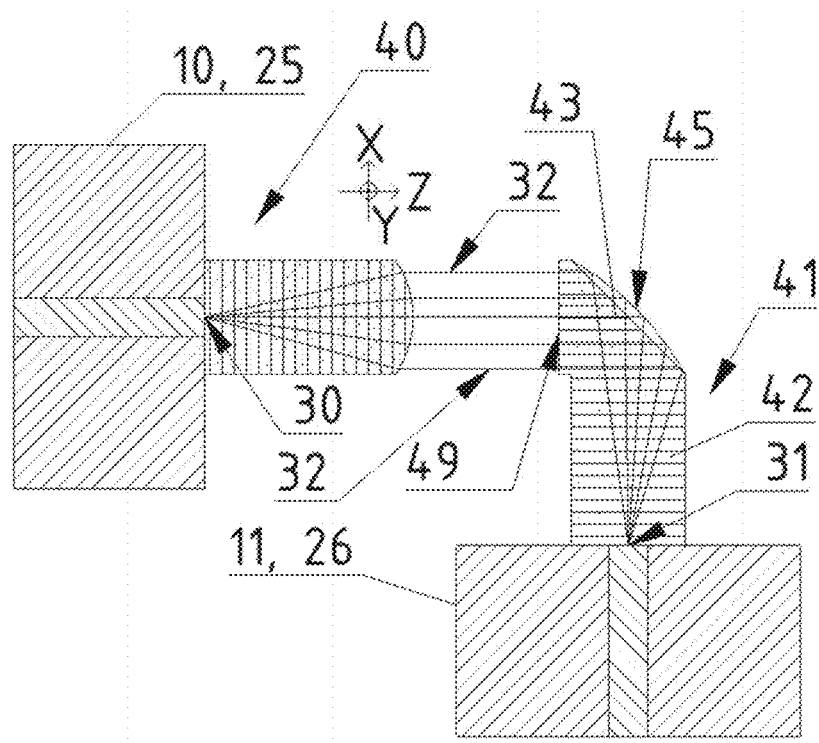
FIG. 7 shows a further exemplary embodiment of an optical system having both refractive and reflective beam-shaping elements.

FIG. 7 shows a further variation of the configuration according to this disclosure of an optical coupling using a convex mirror 45 rather than a refractive optical structural element. Said mirror can either be based on total internal reflection at the interface between the beam-shaping element 42 and the surrounding material, or can contain a metal coating on said interface.

Figure 8:
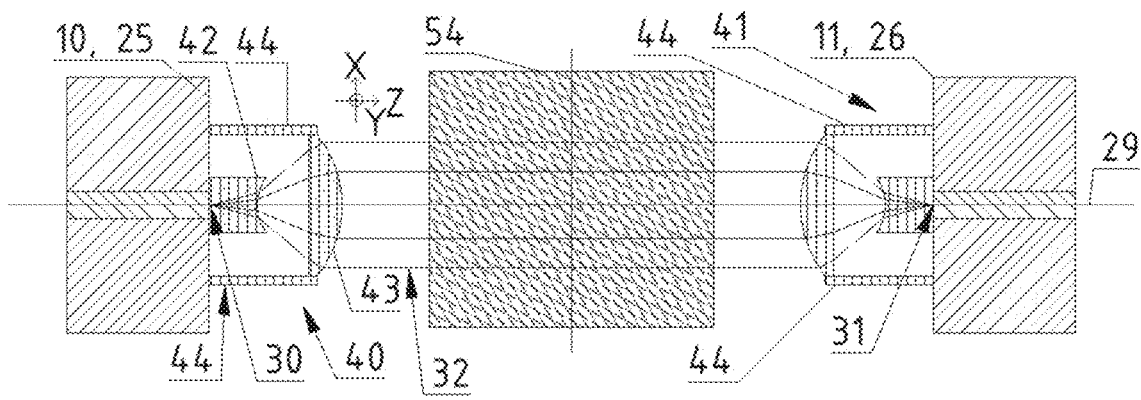
FIG. 8 shows a further exemplary embodiment of an optical system having an additional optical element that is introduced into the coupling section.

FIG. 8 shows a further exemplary embodiment of the optical system, which has an additional optical element 54 that is introduced into the coupling section. Introducing the additional optical element 54 is made possible in particular by the fact that, owing to the enlargement and collimation of the mode field 32 between the two optical components 10, 11, a light beam which can propagate over relatively long distances with little expansion is inherently formed. The additional optical element 54 can be for example structural elements that are only difficult to realize on optical chips, for example optical thin-film filters, polarizers, beam splitters, waveplates, or non-reciprocal structural elements such as Faraday rotators or isolators. Introducing additional optical elements 54 of a different design is likewise possible. In particular, the additional optical element 54 can be a via in a chip, a transparent window in a chip, or a transparent chip.

Figure 9:
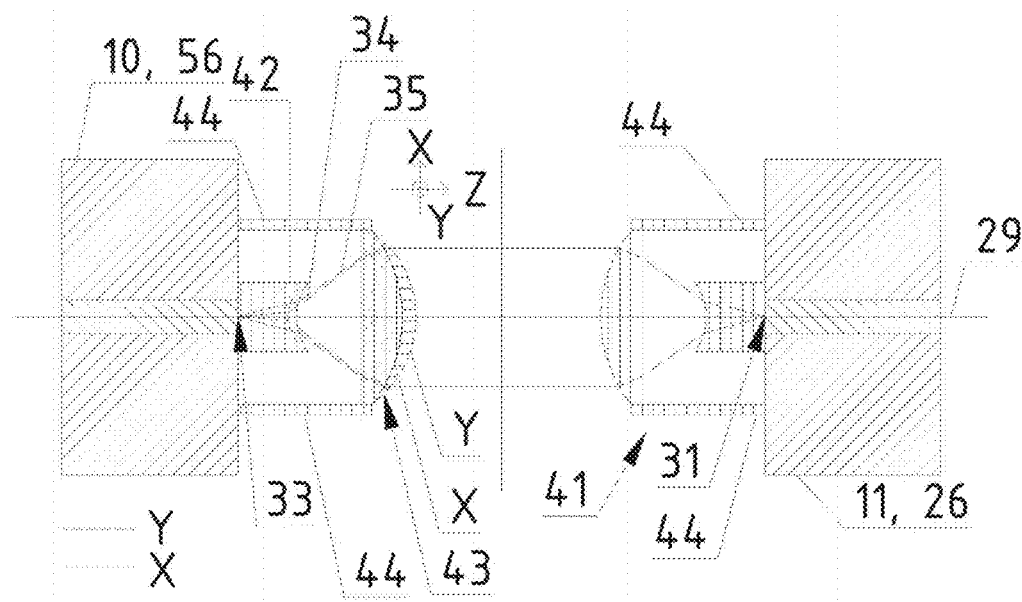
FIG. 9 shows an exemplary embodiment of an optical coupling changing a non-rotation-symmetric beam profile to a rotation-symmetric beam profile.

Using freeform optics can permit cascading of a plurality of beam-shaping elements 40, 41, as a result of which in particular the number of degrees of freedom can be increased. As is schematically illustrated in FIG. 9, it is also possible hereby, alternatively or additionally, to change a non-rotation-symmetric beam profile 33, having a smaller extent in one direction 35 and a greater extent in the other direction 34, to a rotation-symmetric beam profile 31, wherein the beam-shaping elements 40, 41 can be situated in principle at any desired location. The embodiment as per FIG. 9 can thus be used for example for optically coupling edge-emitting semiconductor lasers or integrated optical chips 56 having rectangular waveguide cross sections. Edge-emitting semiconductor lasers frequently have a beam profile which has different divergences in the x- and y-directions. In order to be able to couple such a beam profile efficiently into the second single-mode fiber 26, a configuration of the optical system which is non-rotation-symmetric with respect to the optical axis 29 is necessary. The beam-shaping elements 40, 41 are to this end preferably configured such that the light beams emitted by the semiconductor laser 56 are incident on the single-mode fiber 26 at the same angle where possible and additionally form a mode field 31 which is adapted to the mode field of the single-mode fiber 26. To ensure that the requirements with respect to the positioning tolerance are as low as possible, it is possible to preferably use the adaptation method that is schematically illustrated in FIG. 9 and will be described below:

Diameters of the beam profile 30 of the semiconductor laser 56 and of the mode field 31 of the second single-mode fiber 26 are determined. Manufacturer information or, alternatively or additionally, measurement of the beam profile can be used for this. On the basis of the ascertained beam profile 30, 31, it is possible to determine an advantageous configuration of the optical system both for the semiconductor laser 56 and for the single-mode fiber 26. A suitable design of the beam-shaping elements can here take into account in particular the attainable positioning tolerances for the optical structural elements to be connected, take into consideration a cladding material which may be optionally used, and/or prevent process-related deviations from the desired shape, such as shrinkage due to a corresponding pre-compensation. The semiconductor laser 56 and the second single-mode fiber 26 can then be fixed successively or together in a lithography system. The position of the semiconductor laser is detected by camera-based detection or a confocal imaging method. The position of the fiber or of the fiber core can be detected, as described in more detail above, by camera-based detection or camera-based detection of light which was coupled into the fiber. The previously specified configuration of the semiconductor laser 56 and of the second single-mode fiber 26 are written and developed. Subsequently, the semiconductor laser 56 and the second single-mode fiber 26 can be released from their fixed state and be mounted on the common base plate 50 in the previously defined position, wherein it is possible to perform active alignment if need be. In a further step, the beam-shaping elements 40, 41 can optionally be embedded in a common embedding medium. The refractive index contrast which is reduced in this fashion is preferably taken into consideration as well in the configuration and the determination of the optical elements. The adaptation method described here can be used in particular for coupling fibers, in particular single-mode fibers, to radiation sources such as lasers or SLEDs, to planar waveguides, or to photodiodes. If it is not necessary to reduce the requirements with respect to the positioning accuracy, one of the beam-shaping elements 40, 41 can also only be written onto the laser or fiber facets.

Figure 10:
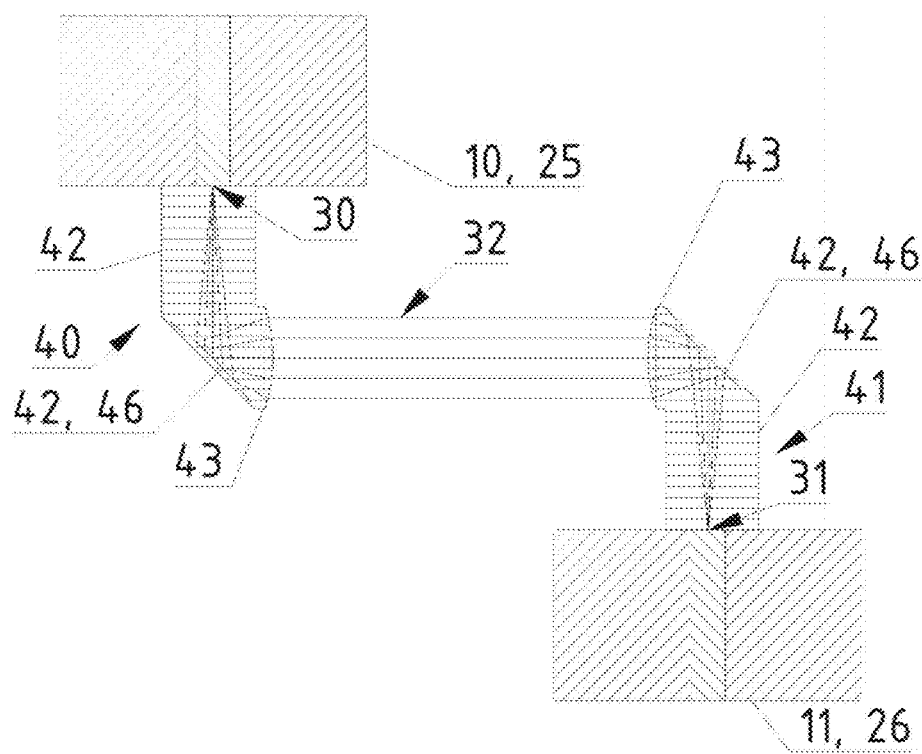
FIG. 10 shows a further exemplary embodiment of an optical system, in which the beam-shaping elements combine refractive and reflective surfaces with one another.
Figure 11:
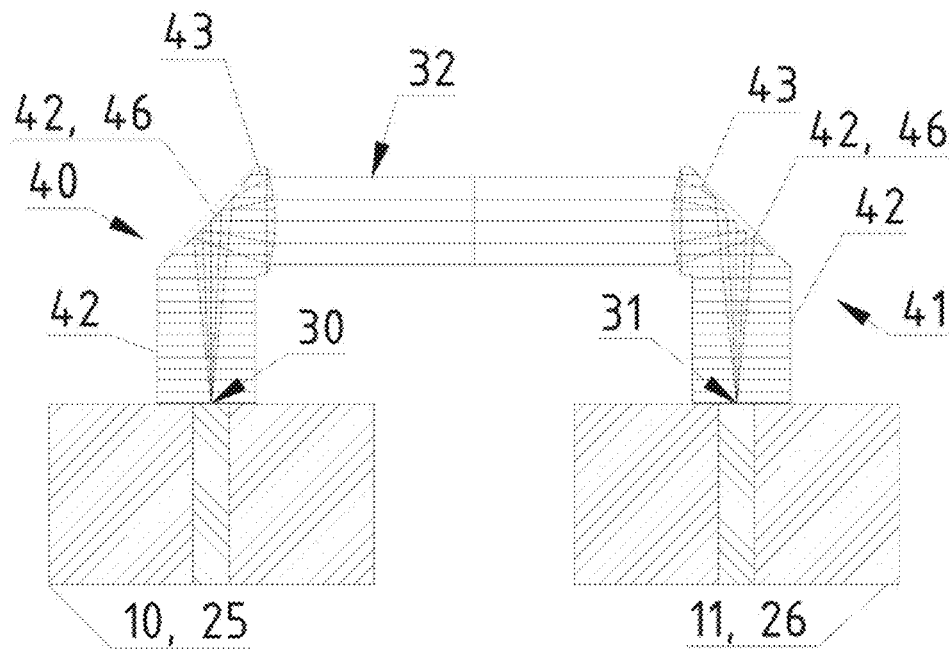
FIG. 11 shows a further exemplary embodiment of an optical system, in which the beam-shaping elements combine refractive and reflective surfaces with one another.
Figure 12:
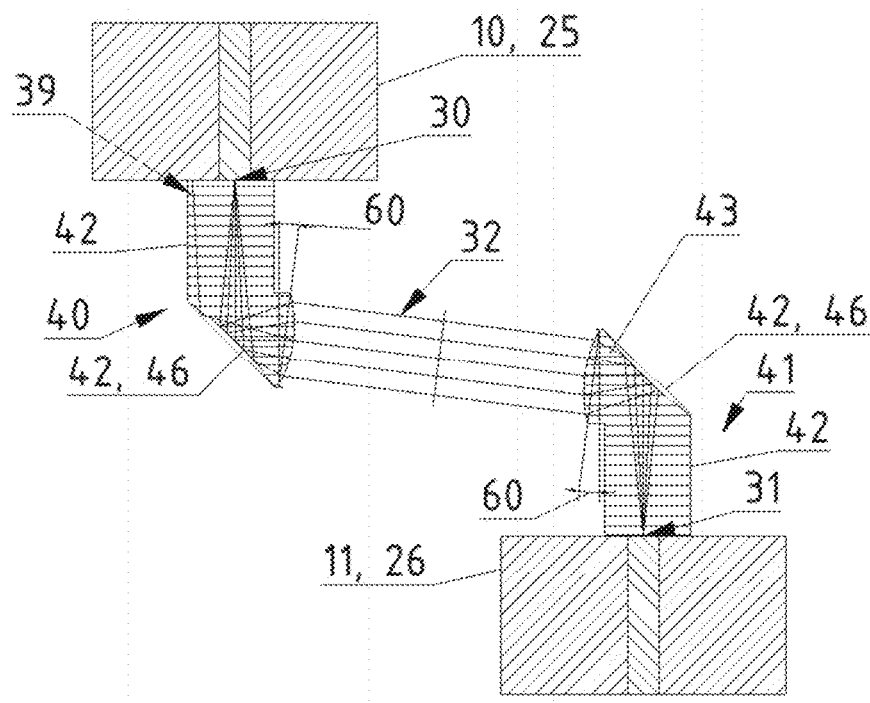
FIG. 12 shows a further exemplary embodiment of an optical system, in which the beam-shaping elements combine refractive and reflective surfaces with one another.

FIGS. 10, 11 and 12 each show a further possibility for configuring an optical coupling, specifically by using concave mirrors 46 rather than refractive optical structural elements. The optical systems which are schematically illustrated in FIGS. 10, 11 and 12 differ from one another merely in terms of the respective embodiment of the beam path.

Moreover, FIG. 12 shows a further possibility for avoiding back-coupling due to back-reflection 39. This can be necessary or particularly advantageous for various optical structural elements, in particular for superluminescent diodes (SLEDs) or lasers. For suppressing back-coupling due to back-reflections, surfaces 47 of the beam-shaping elements 40, 41 which could cause back-coupling are inclined by an angle 60 (inclination angle) such that light beams can no longer strike interfaces perpendicularly. The reflected light 39 consequently no longer travels back into the optical component 10, 11. In a preferred configuration, the angle 60 can have a value of 3° to 40°, with particular preference of 5° to 15°, in particular of 7° to 10°. The angle 60 is generally dependent on the optical structural elements used and is preferably of the type such that no significant back-coupling due to back-reflections can occur in the optical system.

Figure 13:
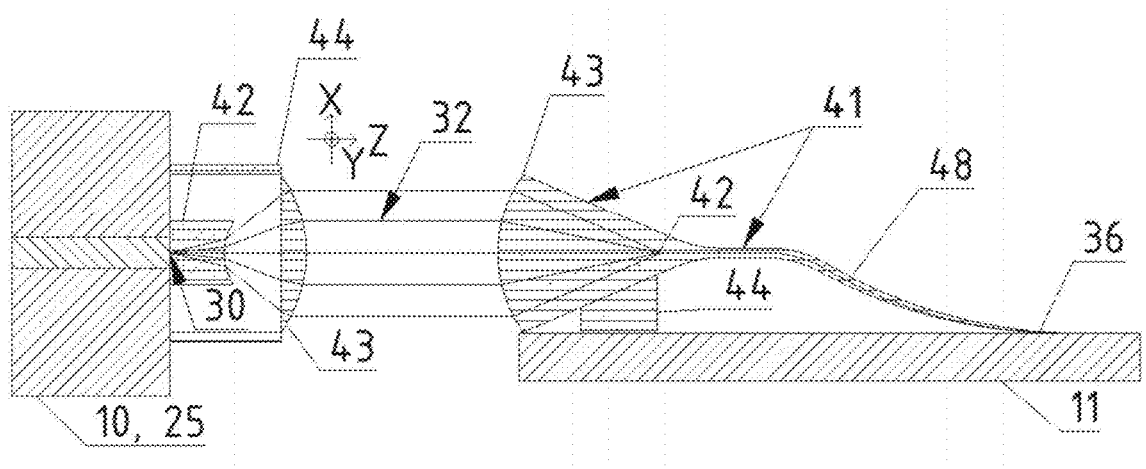
FIG. 13 shows a further exemplary embodiment of an optical coupling between a single-mode fiber and an integrated waveguide.

FIG. 13 shows a further exemplary embodiment of an optical system, which is designed to couple a light beam emitted by the single-mode fiber 25 into the beam-shaping element 41, which comprises an optical freeform waveguide 48. For optically coupling a photonic circuit to the single-mode fiber 26, initially the structure of the freeform waveguide 48 is written onto a sharply pointed narrowing ("inverse taper") 36 of an integrated silicon waveguide 85, wherein the integrated waveguide 48 is dimensioned such that light can be efficiently coupled into the integrated waveguide 85. In addition to the waveguide 48, the beam-shaping element also has a widening part 42, in which the light beam emerging from the waveguide 42 strongly diverges, preferably with a divergence angle of 2° to 45°, with particular preference 4° to 30°, and with very particular preference 10° to 25°. Subsequently, the light is collimated in the collimating part 43 of the optical component 41 and is focused by way of a further lens onto the facet of the optical component 10, such as in the case of a single-mode fiber.

Figure 14:
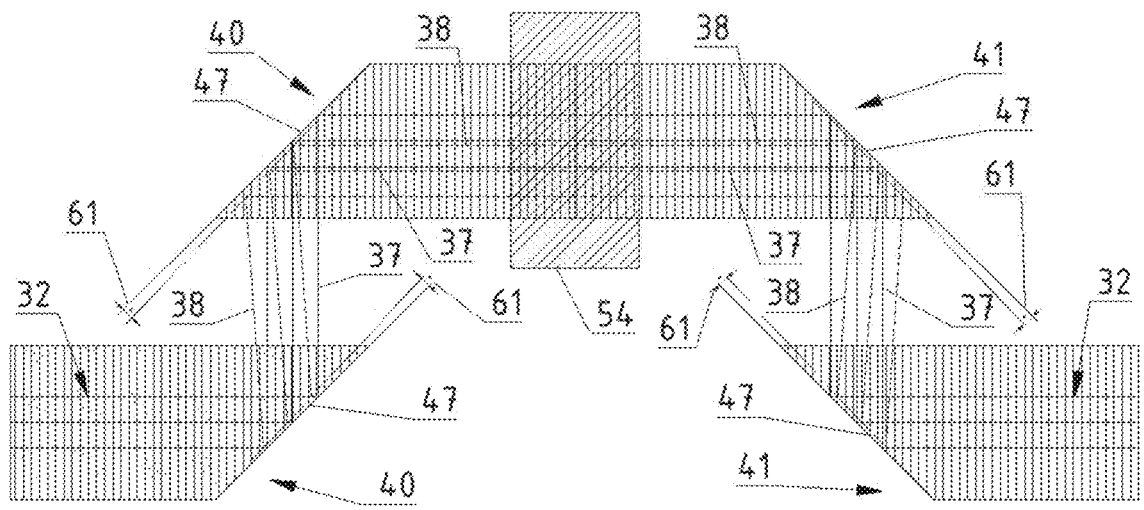
FIG. 14 shows a further exemplary embodiment of an optical system, in which angle deviations of reflective surfaces of the beam-shaping elements are automatically compensated.

FIG. 14 shows a further exemplary embodiment of an optical system, in which angle deviations of reflective surfaces of the beam-shaping elements 40, 41 are automatically compensated.

Figure 15A:
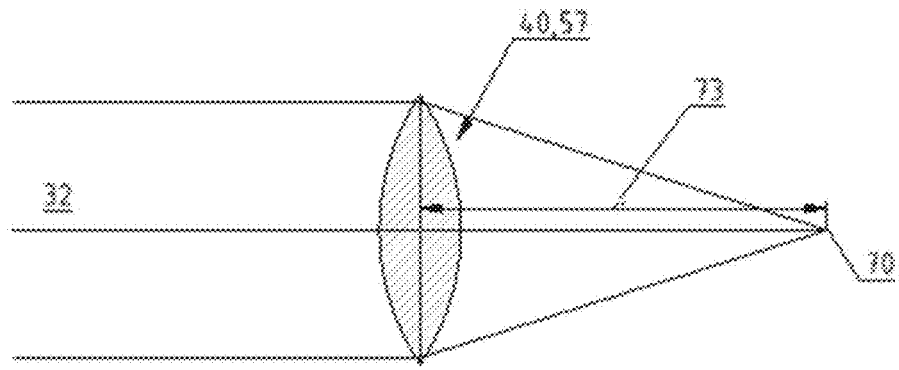
FIGS. 15a-15d show exemplary embodiments of beam-shaping elements to reduce the reflection losses by replacing a few optical interfaces having a high index contrast with a plurality of optical interfaces having a low refractive index, wherein the beam-shaping element is embodied in the form of (FIG. 15a) a biconvex lens, (FIG. 15b) three biconvex lenses in an embedding medium having a lower refractive index than the three biconvex lenses, (FIG. 15c) three biconcave lenses in an embedding medium having a higher refractive index than the three biconcave lenses, and (FIG. 15d) with three cavities in the form of biconcave lenses in a material having a refractive index that is increased as compared to the cavity.
Figure 15B:
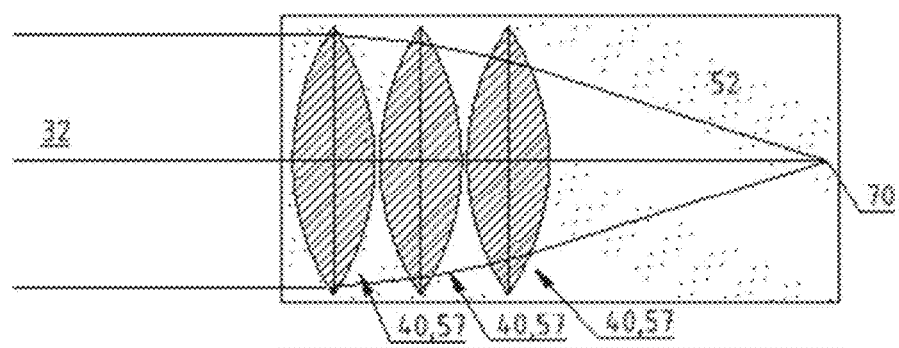
Figure 15C:
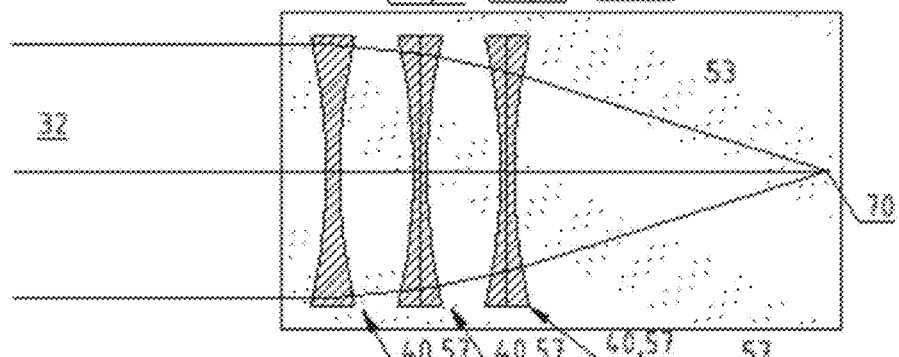
Figure 15D:
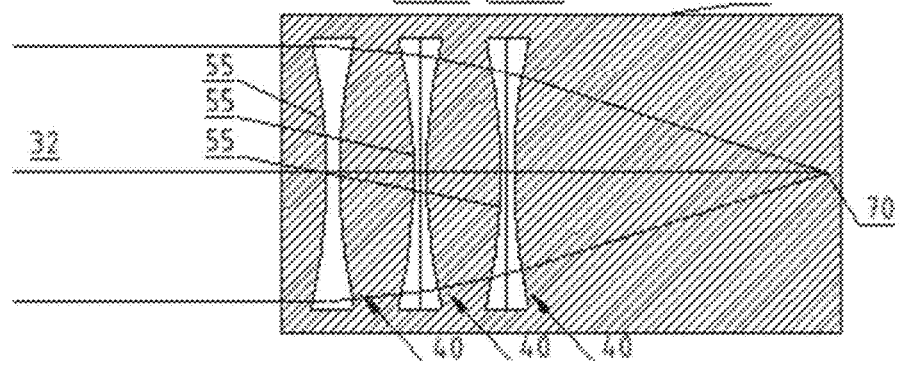

As already mentioned, the optical losses depend in particular on the number of the optical interfaces and the difference between the refractive indices (index contrast) between the two materials forming an interface. FIGS. 15a) to d) show exemplary embodiments of different beam-shaping elements 40, in which few optical interfaces having a high index contrast are used by a multiplicity of optical interfaces having a low refractive index to reduce the reflection losses. While in FIG. 15a) the beam-shaping element 40 is formed from a single converging lens (biconvex lens), which has a focal point 70 and a focal length 73, FIGS. 15b) to d) show different beam-shaping elements 40, which have a plurality of lenses of different shapes, which are respectively introduced into the embedding medium 52, 53. FIG. 15b) schematically shows a further exemplary embodiment of the beam-shaping element 40 made of resist material 57, which has three biconvex lenses which are introduced in the embedding medium 52 having a lower refractive index than the three biconvex lenses. FIG. 15c) schematically shows a further exemplary embodiment of the beam-shaping element 40, which has three biconcave lenses which are introduced into the embedding medium 53 having a higher refractive index than the resist material 57 of the three biconcave lenses. FIG. 15d), finally, illustrates a further exemplary embodiment of the beam-shaping element 40, in which the beam-shaping element 40 is embodied in the form of three cavities 55 in the form of biconcave lenses. The cavities 55 can be filled with a medium 52 having a lower refractive index than the resist, or can remain unfilled. In particular, the refractive indices in the cavities can differ. To produce the beam-shaping elements, it is also possible to use a material which has a refractive index that permanently changes due to the exposure to light. Suitable for this could be in particular an ORMOCER®, a glass, or a polymer.

Figure 16:
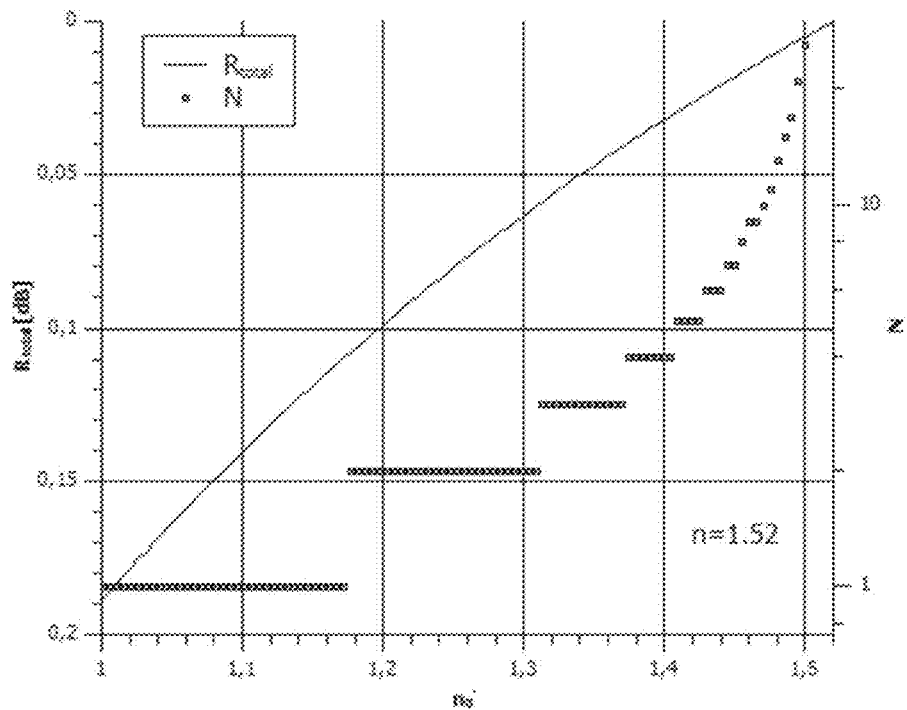
FIG. 16 shows a depiction of the results from equation (6) under the assumption of a refractive index of the lenses n=1.52.

In general terms, an optical system having many optical interfaces and a low index contrast has fewer back-reflections than an optical system which is equivalent with respect to the refractive power and has a high index contrast and few interfaces. This is illustrated by way of example in FIG. 16, in which the results of the above equation (6) are illustrated under the assumption that the refractive index n of the lenses is 1.52. As is illustrated in FIG. 16, the result is a decrease in the total loss $R_{total}$ as the refractive index $n'_0$ of the surrounding medium approaches the refractive index of the lenses. It is possible in this way to thus reduce coupling losses, but at the expense of a large number of optical interfaces. As already mentioned above, the number of the optical interfaces can be selected to be preferably from 1 to 100, with particular preference from 4 to 50, in particular from 6 to 12.

Figure 17:
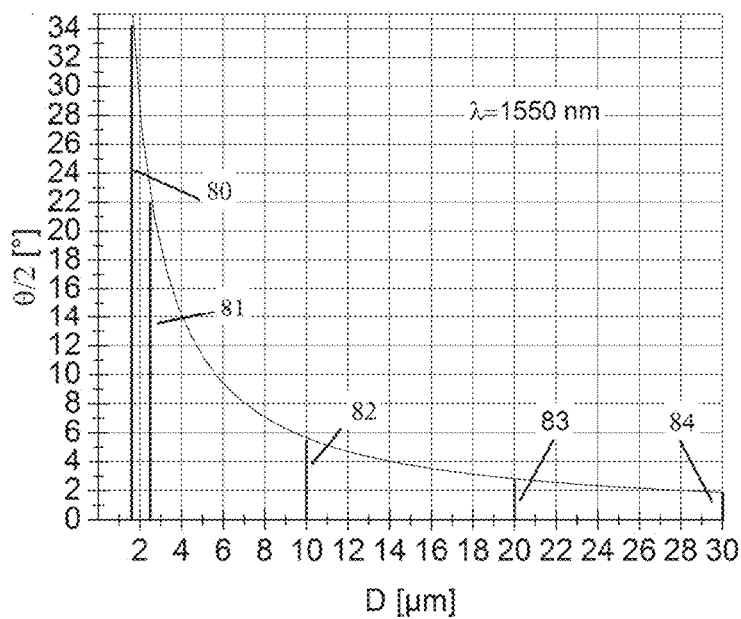
FIG. 17 shows a depiction of the profile of the half opening angle ½ Θ in degrees)(° for a wavelength λ=1550 nm with respect to a diameter D of the mode field with an intensity of the light of $1/e^2$, i.e., approx. 13.5%, of the maximum intensity of the light.

As already mentioned above, a lowering of the positioning accuracy can bring about an increase in the sensitivity of the optical structural elements with respect to a rotational positioning accuracy. Here, the divergence, which is quantified by the opening angle Θ, can be used in the case of emission of a mode field as a starting point for an estimation of the positioning tolerance with respect to rotational deviations in the fixing process. FIG. 17 shows the profile of the half opening angle ½ Θ in degrees (°) for a wavelength λ=1550 nm with respect to a diameter D of the mode field at an intensity of the light of $1/e^2$, i.e., approx. 13.5%, of the maximum intensity of the light, and indicates the following configurations for different diameters D of the mode field:

mode field converter (taper) based on silicon-on-insulator (SOI) waveguides 80 with a mode field diameter of 1.6 µm and a half opening angle of 34°;

mode field converter (taper) based on indium phosphide (InP) 81 with a mode field diameter of 2.5 µm and a half opening angle of 22°;

single-mode fiber (SMF) 82 with a mode field diameter of 10 µm and a half opening angle of 5.6°;

expanded mode field 32 of the beam expander 83 with a mode field diameter of 20 µm and a half opening angle of 2.8°; and expanded mode field 32 of the beam expander in the embedding medium 84 with a beam profile of 30 µm and a half opening angle of 2°.

Figure 18:
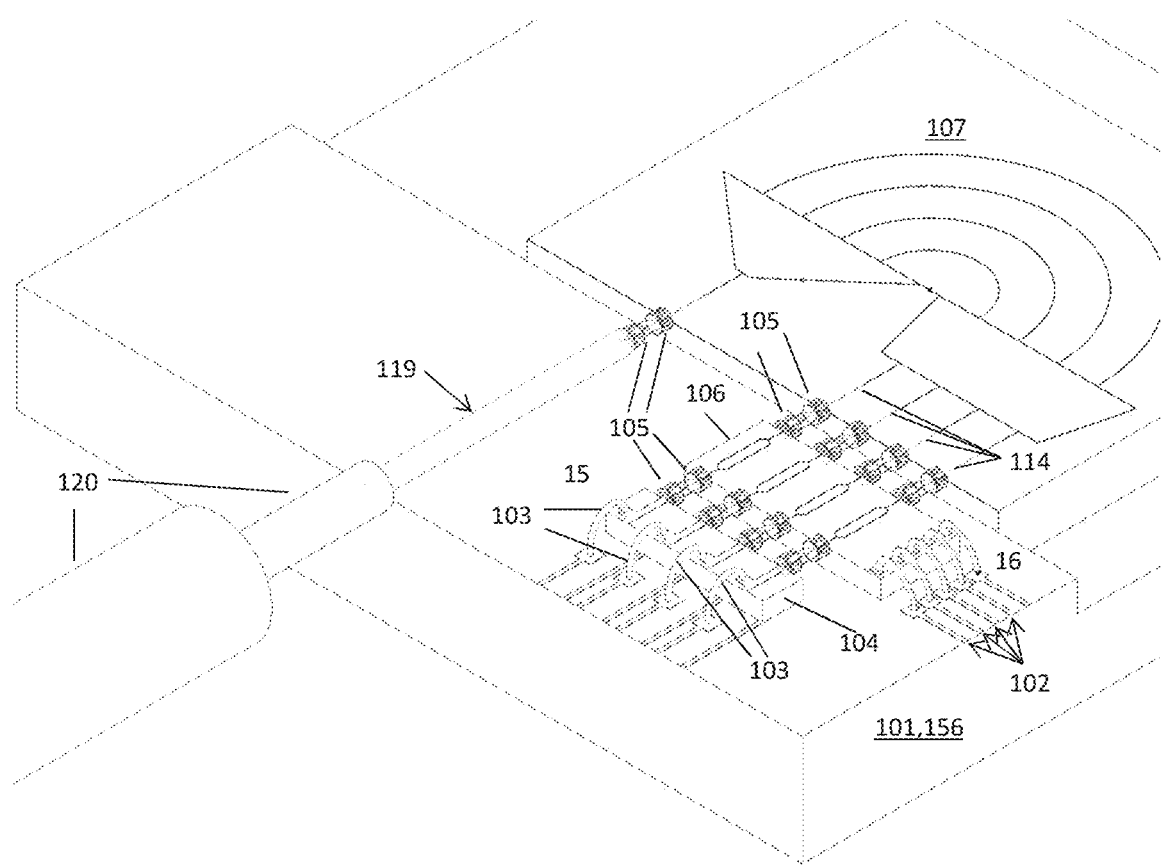
FIG. 18 shows a further exemplary embodiment of an optical system, in which each optical component has a multiplicity of coupling locations and associated beam-shaping elements.

FIG. 18 schematically shows a further exemplary embodiment of an optical system, in which the optical components, in the present case a laser bar 104 and a modulator array 106, can each have a plurality of coupling locations 130 to 137, wherein the optical system can be produced in accordance with the following steps:

1. Provision of a base plate 101, which has conductor tracks 102 for radio-frequency signals. The base plate 101 has a surface profile that makes possible easy fixing of all optical structural elements, if possible, at an appropriate height. The term "appropriate" here means that the centers of the mode field profiles of all optical structural elements are located at the same height.
2. Design of the optical system. This step comprises defining the position of the optical components 104 and 106 and the position of the beam-shaping elements 105 to be prepared. The exemplary embodiment as per FIG. 18 is an array made up of edge-emitting lasers 104, in electrical contact with bonding wires 103, beam expanders 105, an optical chip 106 having an array of electro-optical modulators, in electrical contact with bonding wires 103, and an arrayed waveguide grating (AWG) 107 having optical mode field expanders 114, and an optical fiber 119 with cladding 120. The design of the optical system furthermore comprises the simulation of the beam expanders 105 with respect to optimum coupling and the greatest possible expansion in the collimated part of the beam profile.
3. Converting the simulation data created in step 2 into a machine-readable format and producing the beam-shaping elements 105 at the optical components 104, 106, 107 to be connected, as a result of which the optical components which have been supplemented by the beam-shaping elements are obtained.
4. Fixing the optical components obtained by the beam-shaping elements to the positions provided as per step 3. In this case, a positioning accuracy is preferably observed, which is obtained from steps 2 and 3.
5. Optional embedding of the optical components which have been supplemented by the beam-shaping elements in a surrounding medium.

Figure 19:
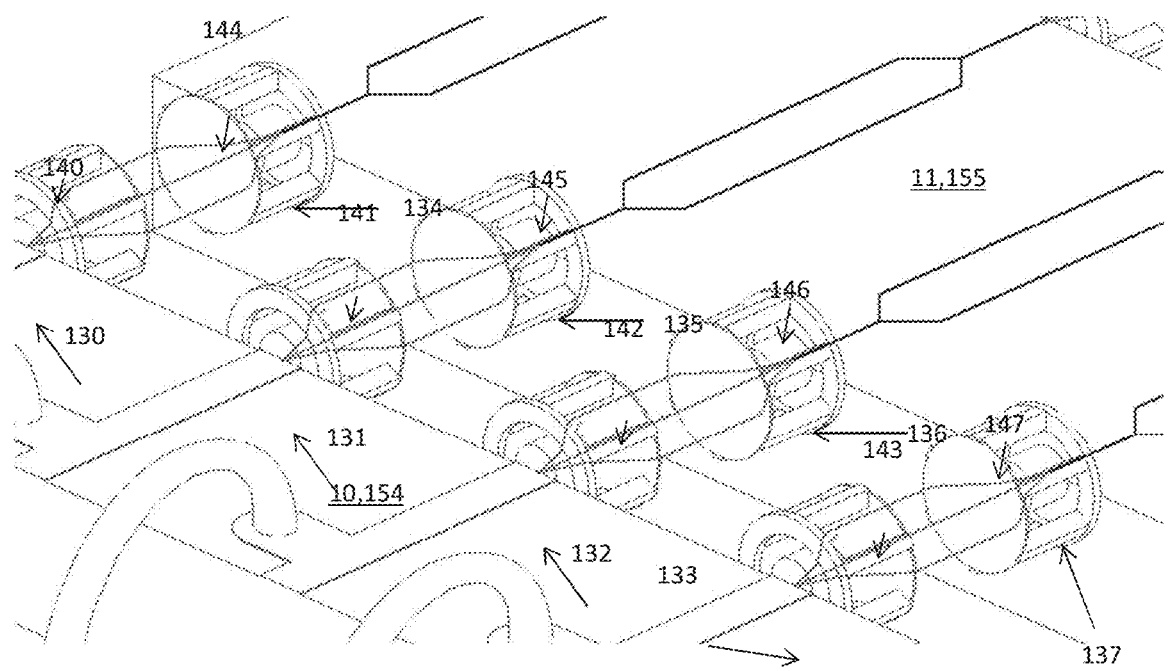
FIG. 19 shows an exemplary connection of optical components, which each have a multiplicity of coupling locations and associated beam-shaping elements.

FIG. 19 shows the connection of optical components 10, 11, which each have a plurality of facets 130 to 137. On account of the requirements with respect to the adjustment accuracy which are decreased according to this disclosure, it is possible to connect the first optical component 10 and the second optical component 11 via the plurality of the coupling locations 130 to 137 using appropriate beam-shaping elements 140 to 147, which are schematically illustrated in FIG. 19.

Figure 20:
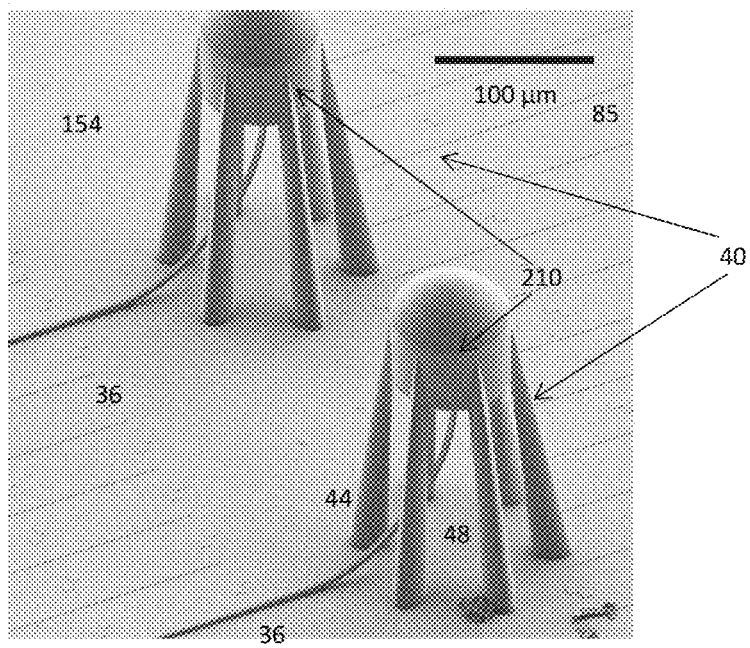
FIG. 20 shows an electron-microscopic recording of a further exemplary embodiment of the beam-shaping elements which each have a combination of a freeform optical waveguide and a collimating part.

FIG. 20 shows a recording, taken using an electron microscope, of a further exemplary embodiment of the beam-shaping elements 40, 41, which each have a combination of an optical waveguide 48 and a collimating part 43. The beam-shaping elements 40, 41 illustrated in FIG. 20 can be used in particular in the further exemplary embodiment of the optical system in FIG. 21. It is possible hereby to optically connect two optical components 10, 11 to one another even at a plurality of coupling locations with low requirements with respect to adjustment accuracies. In this case, the optical components 10, 11 are placed each on spacers 51, with the result that a defined distance between the optical components 10, 11 is given. In the exemplary embodiments shown, the optical component 10 is a surface-emitting structural element, while 11 represents an optical chip having planar waveguides that extend in the chip plane and are connected to the beam-shaping elements 40 which emit perpendicularly to the chip plane.

Figure 26:
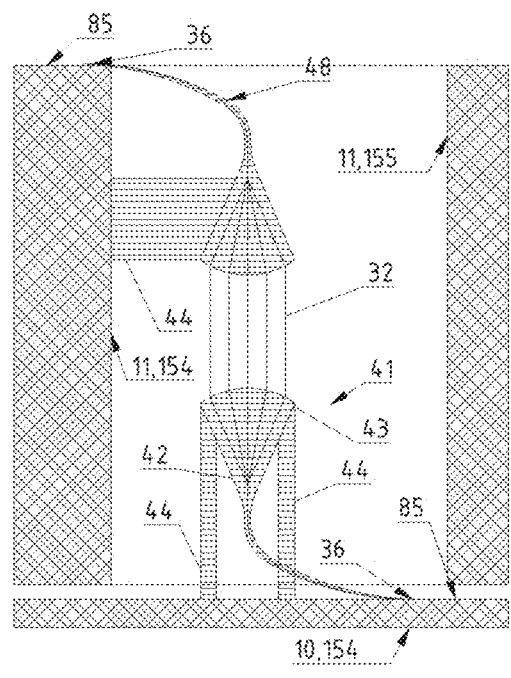
FIG. 26 shows a further exemplary embodiment of an optical system consisting of two stacked optical chips, wherein one of the optical chips has an optically transparent cutout and wherein the optical connection is effected via beam-shaping elements which are designed such that they deflect light which is propagating in planar waveguides on the optical chips into a direction which is oriented substantially perpendicularly to the chip surfaces.

Furthermore, two chips 154 and 155 can also be connected to planar waveguides 85, which emit in the chip plane, in a manner such that they are stacked one on top of the other and the surfaces face in the same direction. A corresponding exemplary embodiment is illustrated in FIG. 26. In this case, the beam-shaping elements are designed such that they result in light emission in a direction that is oriented substantially perpendicularly to the surface of the chips. In the case sketched out in FIG. 26 emitted, the beam-shaping element connected to the chip 155 is designed such that the light emission is effected through a cutout or a transparent window in the chip or that light is received from this direction. In particular, the material can be the material from which the chip is made. In a further refinement, the light is guided along the edge of the chip, with the result that no window or through-hole in the chip is necessary. It is possible in this way to produce complex stacked multi-chip systems, which may also consist of more than the two chips shown here.

Figure 21:
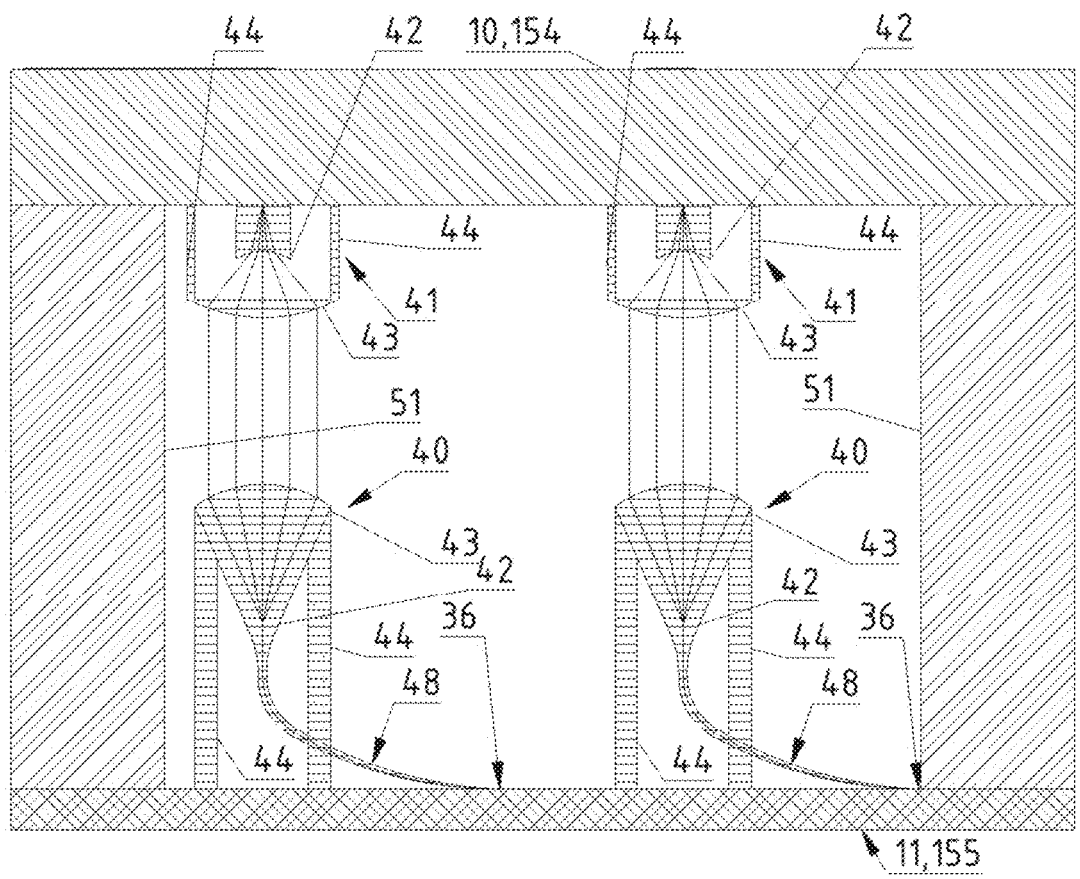
FIG. 21 shows a further exemplary embodiment of an optical system, in which the optical components are spaced apart from one another by dedicated spacers.
Figure 22:
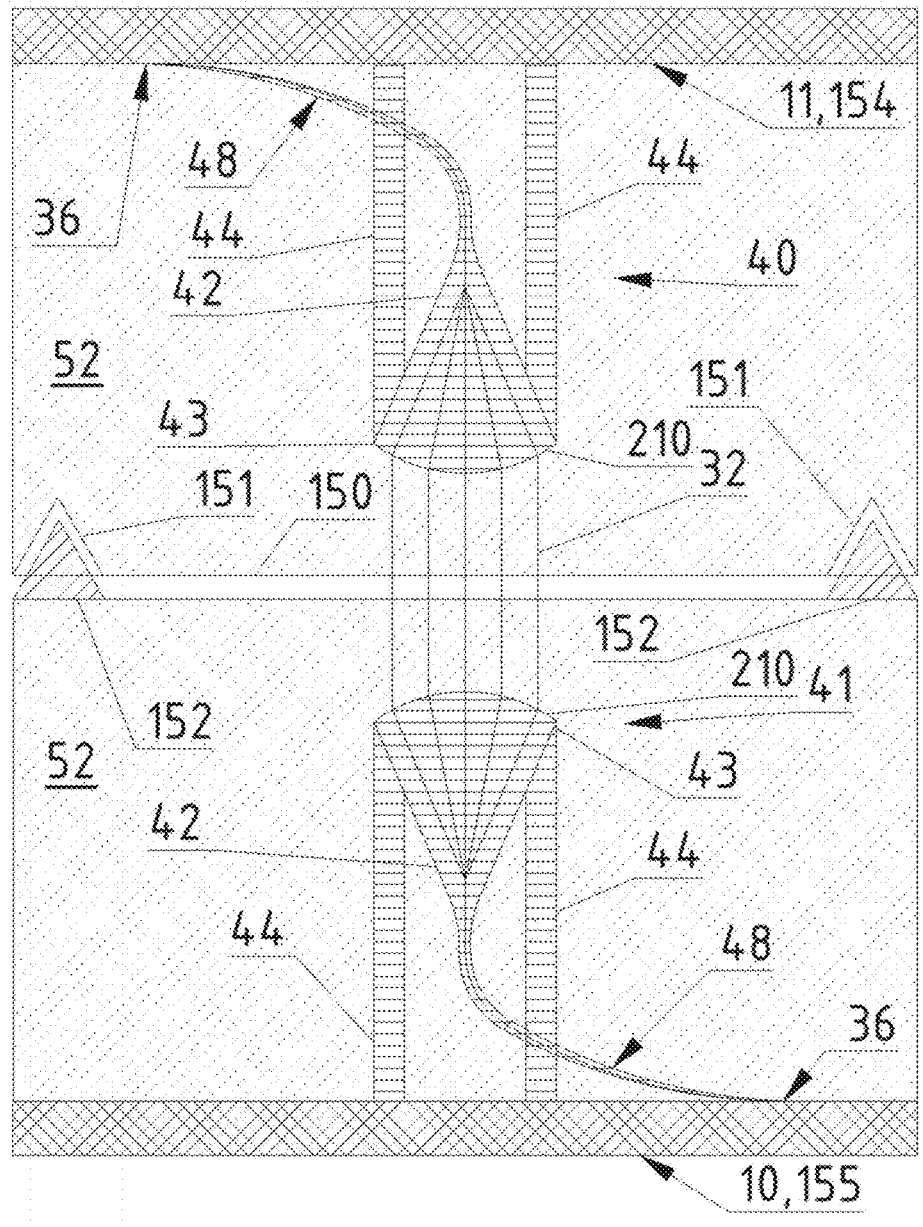
FIG. 22 shows a further exemplary embodiment of an optical system, in which the beam-shaping elements are embedded in a planarized medium to produce a defined distance between the optical components.

In addition to or instead of the spacers, it is also possible, as shown in FIG. 22, to use a surrounding medium 52 which is planarized at the surface 150 and embeds the beam-shaping components 40 and 41. To increase the refractive power of the refractive surface 210 present in the beam-shaping elements 40 and 41, they can be embodied in a cascading form, see also FIG. 6. The planarized surrounding medium is of a nature such that it ensures a precise distance between the optical components 10 and 11. The planarization medium can furthermore optionally be provided with adjustment structures. The latter can consist, for example, of a pin 152 and a groove 151 which is appropriate for the pin. The support structures 44 and the freeform waveguides 48 in FIG. 21 and FIG. 22 are designated such that there is no physical contact between the two elements and in particular no interaction between the light in the freeform waveguide 48 and the support structure 44.

Figure 23:
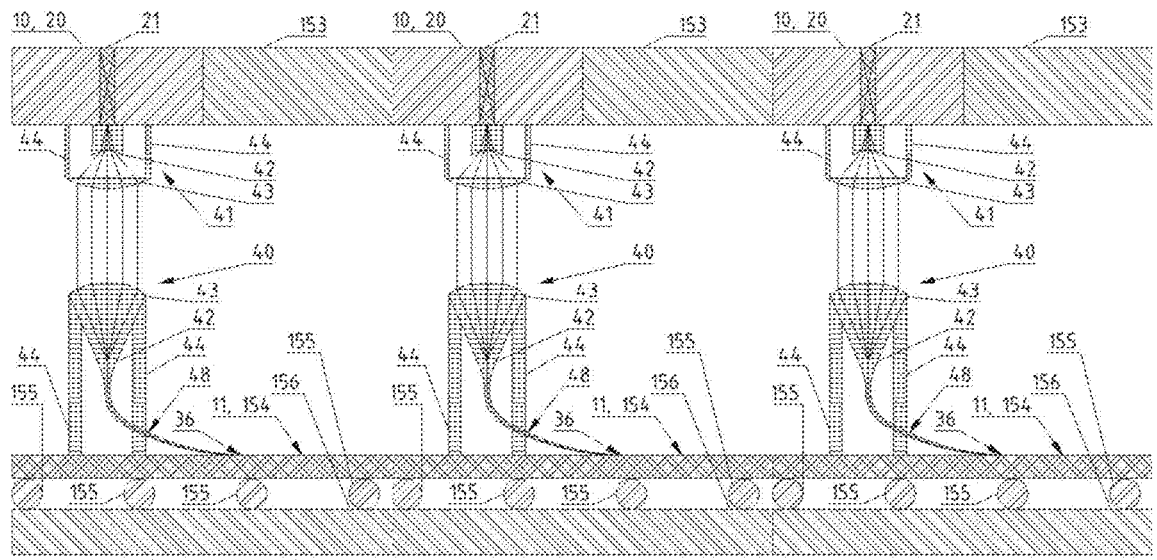
FIG. 23 shows a further exemplary embodiment of an optical system consisting of a multiplicity of optical components which are mounted on an electric printed circuit board or on an electric chip and are connected to a further optical component, for example a fiber array.

FIG. 23 shows the connection of a multiplicity of optical receiver and transmitter components 154 mounted on a printed circuit board or an electrical chip 156 one-dimensional or two-dimensional fiber array 153. The transmitter and receiver components 154 are connected to the semiconductor chip or the printed circuit board 156 by way of electrical contact locations 158. First optical components 10, in the present embodiment optical waveguides such as optical fibers 20, are here connected to the transmitter and receiver components 154, which represent second optical components 11, by way of beam-shaping components 40 and 41. The angle between the beam profiles emitted by the optical components (10, 11) in the case shown is around 90°; only the deflection of the light in the beam-shaping components 40 makes the coupling possible.

Figure 24:
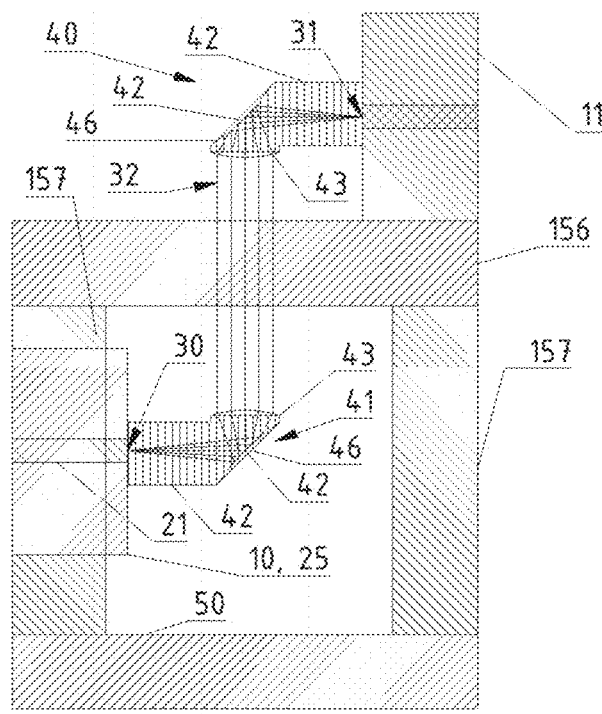
FIG. 24 shows a further exemplary embodiment of an optical system including a coupling between a waveguide that is embedded in a printed circuit board, and an optical chip.

FIG. 24 shows the connection of an optical single-mode fiber 25, which is embedded into an electro-optical printed circuit board 157 and represents a first optical component 10, to a second optical component 11, which is located on the electro-optical printed circuit board 156. For this purpose, the beam-shaping components 40 and 41 are used, wherein the collimated beam profile 32 traverses the electro-optical printed circuit board 156 which is transparent at the relevant location. The traversing location can optionally have a material cutout in the form of a hole. The component 11 can be, for example, an integrated optical chip or an optical interposer.

Figure 25:
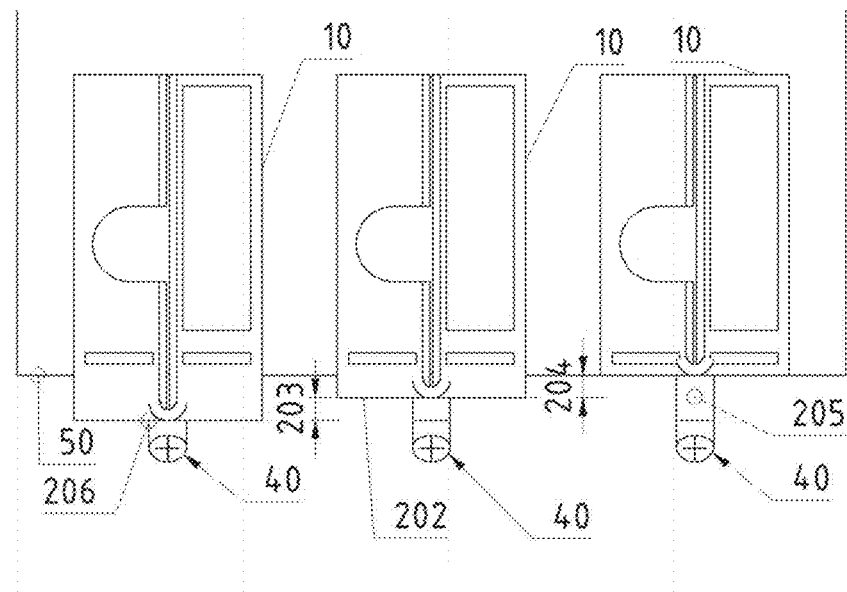
FIG. 25 shows an exemplary embodiment of a plurality of optical components which have been supplemented by a beam-shaping element such that deviations of the optical component due to the production process are compensated by the beam-shaping component.

FIG. 25 shows the compensation of production-related deviations of optical components 10 from their target size 202 by way of changing the beam-shaping component 40. FIG. 25 can be understood to be a plan view of FIGS. 10, 11, 12, 24 in the direction or against the direction of the collimated beam 32 onto the beam-shaping components 40, 41. FIG. 25 can furthermore be understood to be a plan view of beam-shaping component 41 of FIG. 7 in the beam direction. A positive deviation 203 of the optical component from the target size 202 (optical component is too large) is effected by shortening 206 the beam-shaping component 40. A negative deviation 204 from the target size 202 of the optical component 10 is compensated by lengthening 205 the beam-shaping component 40. The deviations shown in FIG. 25 from the target size can occur, for example, due to tolerances when singulating optical chips, for which splitting or sawing methods are used, for example. The compensation made necessary by changes 205, 206 of the beam-shaping component can additionally or exclusively be achieved or improved by further changes in the characteristics of the beam-shaping component 40 such as adaptation of the refractive power. In particular, it can also be supplemented by a further change in characteristics of a further beam-shaping component 11 (not illustrated in FIG. 25).

FIG. 27 shows a further exemplary embodiment, in which the optical system has two optical components 10, 11, specifically the first single-mode fiber 25 as the first optical component 10 and the second single-mode fiber 26 as the second optical component 11. As compared to the previous exemplary embodiments, exactly one beam-shaping element 40 is present here, which is fixedly connected to the first optical component 10, while the second optical component 11 has no beam-shaping element. The exactly one beam-shaping element 40 in this example is set up to change the first beam profile 30 of the first optical component 10 such that, after positioning of the first optical component 10 and of the second optical component 11, an optical coupling between the first optical component 10 and the second optical component 11 is formed. This is accomplished in particular by way of the fact that the exactly one beam-shaping element 40 has the first lens 27, which changes the first beam profile 30 of the first optical component 11 such that a light beam can be incident on the second single-mode fiber 26 in a manner in which it is focused as the second beam profile 31.

Alternatively or additionally to the configurations illustrated here, other optical components can also be connected to one another using the present method. The same steps are performed here, wherein the correspondingly selected optical component is described instead of the single-mode fibers, lasers or optical chips which were used by way of example in the exemplary embodiments. Particularly suitable herefor are the following optical components, which are selected from the group comprising single-mode fibers or multi-mode fibers made of organic or inorganic materials, semiconductor-based integrated optical chips such as lasers, photodiodes, superluminescent diodes, or silicon photonics chips, or other integrated optical chips on the basis of semiconductors or dielectric materials such as glasses, silicon dioxide, silicon nitride, or polymers, optical printed circuit boards, or elements for free beam optics such as lenses, beam splitters, isolators, mirrors or diffraction gratings.

In particular, the optical paths of the exemplary embodiments illustrated can be inverted, i.e., be operated in both directions, as long as only reciprocal media are used. Here, a light-receiving component can adopt the role of the light-transmitting component, and a light-transmitting component can adopt the role of the light-receiving component. Furthermore, an optical component can simultaneously also transmit and receive light.

Suitable in particular for optical coupling are the following beam-shaping elements, which are selected from the group comprising lenses, freeform lenses, gradient index optics (GRIN), cascades of lenses embedded in a medium having a low refractive index contrast with respect to the resist medium (low index step optics, LIS), freeform mirrors based on reflection or total internal reflection (TIR), diffractive optical elements, photonic crystals and optical waveguides.

FIGS. 28 to 34 show specific embodiments designed for coupling to waveguides which do not meet the associated chip edge perpendicularly. The inclination of the waveguides with respect to the normal direction of the chip edge prevents light from being able to be partially coupled back into a guided mode of the waveguide upon output coupling, as a result of which it is possible in particular to avoid reflection in semiconductor lasers or optical semiconductor amplifiers. For effective coupling to such waveguides or waveguide arrays, it is advantageous, in addition to the mode profile, to adapt the propagation direction of the light emitted by the facet in free space, wherein a propagation direction perpendicular to the chip edge can preferably be achieved. This can be advantageous in particular if an array of waveguides which meet the facet at an angle is to be coupled to an array of waveguides which meet said facet perpendicularly, such as a fiber array. In addition, a reduction in accuracy requirements when placing the chips can be desirable, which can be accomplished in particular by widening the mode field diameter. These exemplary embodiments can in particular also have features of the arrangement illustrated in FIG. 12. Furthermore, the beam-shaping elements illustrated in FIGS. 28 to 34 can also be present in other configurations or in further configurations. For example, in particular the exemplary embodiments illustrated in FIGS. 30 to 33 can also be embodied with the beam-shaping elements illustrated in FIG. 34.

Figure 28:
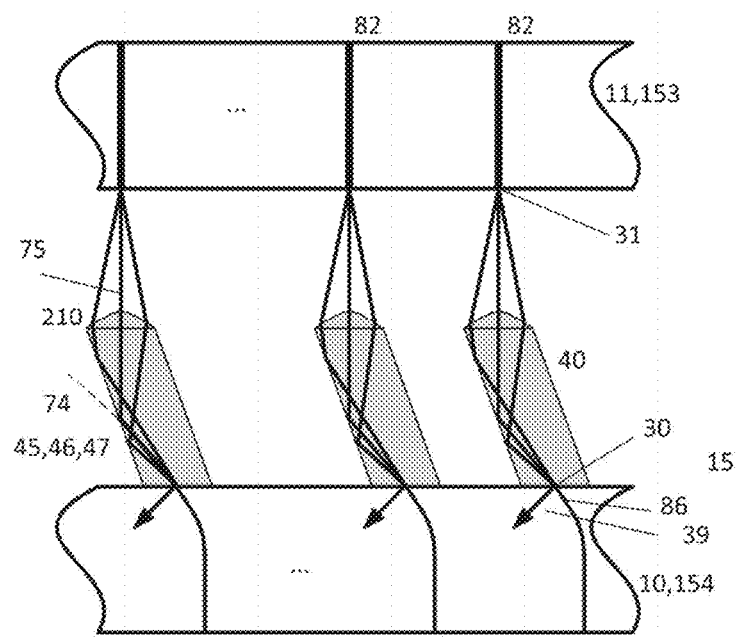
FIG. 28 shows a schematic illustration of an exemplary embodiment of coupling to waveguides which meet the associated chip edge at an angle, i.e. not perpendicularly.

FIG. 28 shows a preferred embodiment in which one or more waveguides 86 of an optical chip 154 meet the facet at an angle, i.e., not perpendicularly, with the result that the back-reflection 39 that occurs at the facet cannot be coupled back into a guided mode of the respective waveguide 86. By way of particular beam-shaping elements 40 which are attached at the facet of the optical chip 154, it is possible to achieve efficient coupling to a second chip or to a fiber array 153, in which the waveguides meet the chip edge or the array edge perpendicularly. In addition to the beam profiles 30, 31, the beam-shaping elements can to this end preferably also adapt propagation directions 74, 75 of the beams to one another. For example, they can have concave, convex or plane mirrors 45, 46, 47 to this end, which can utilize for example the principle of total internal reflection at a dielectric interface. In addition, the beam-shaping elements can have refractive surfaces 210.

Figure 29:
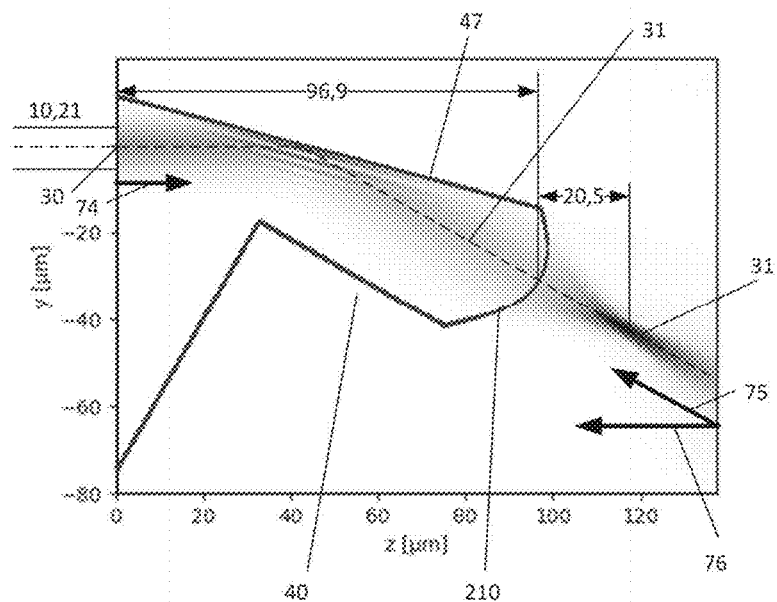
FIG. 29 shows a schematic illustration of an exemplary embodiment of a beam-shaping element which adapts not only the beam profile but also the propagation direction of two beams to one another.

FIG. 29 shows, by way of example, an exemplary embodiment of a corresponding beam-shaping element. The element was designed for a waveguide which meets the edge of an InP chip at 9° with respect to the normal direction 76 and has at the facet an elliptical mode field of approximately 3 µm diameter in the horizontal direction and approx. 3 µm diameter in the vertical direction, and effects a deflection in the direction of the facet normal and an expansion to a circular beam profile having a diameter of approx. 10.4 µm.

Figure 30:
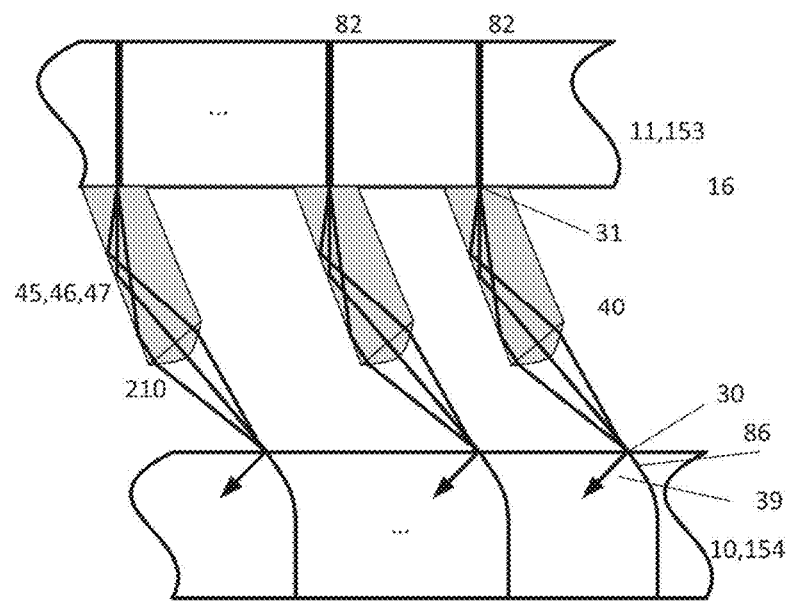
FIG. 30 shows a schematic illustration of an exemplary embodiment of coupling to waveguides which meet the associated chip edge at an angle, wherein the beam-shaping elements are located on a second chip or fiber array in which the waveguides meet the edge perpendicularly.
Figure 31:
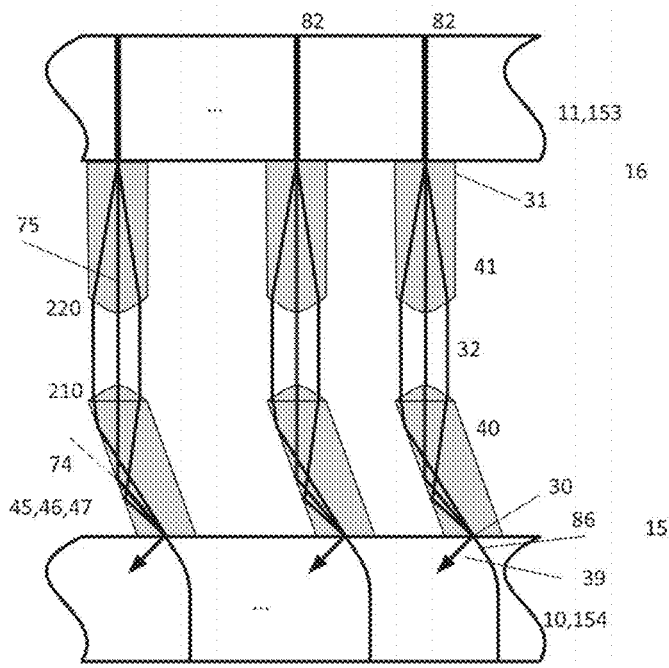
FIG. 31 shows a schematic illustration of an exemplary embodiment of coupling to waveguides which meet the associated chip edge at an angle, wherein two beam-shaping elements are used per coupling location.
Figure 32:
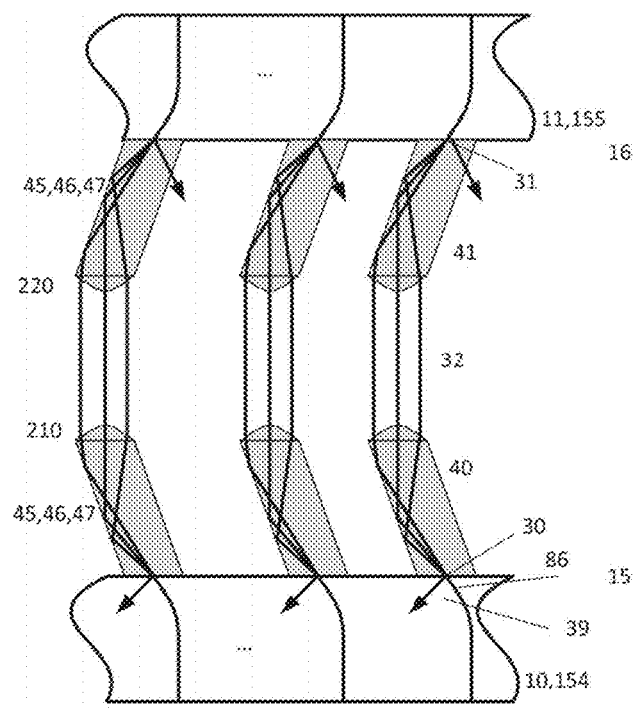
FIG. 32 shows a schematic illustration of an exemplary embodiment of coupling two chips to waveguides which meet the associated chip edge at an angle, wherein two beam-shaping elements are used per coupling location.
Figure 33:
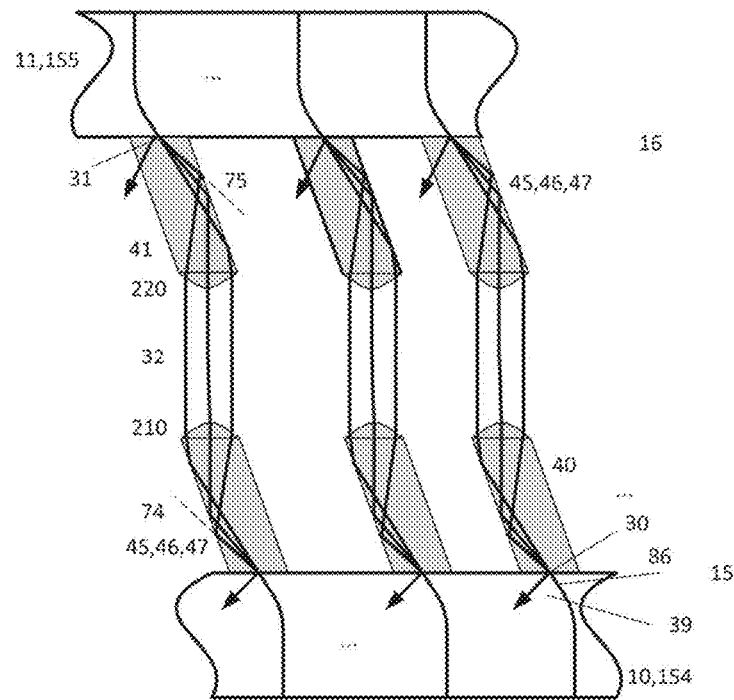
FIG. 33 shows a schematic illustration of a further exemplary embodiment for coupling two chips to waveguides which meet the associated chip edge at an angle, wherein two beam-shaping elements are used per coupling location.
Figure 34:
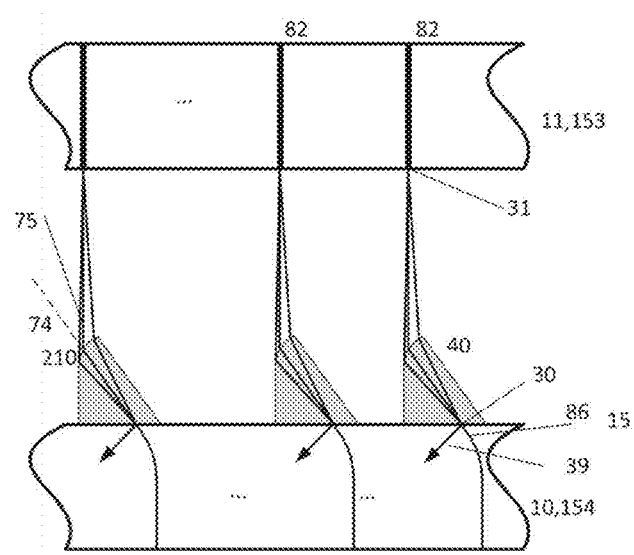
FIG. 34 shows a schematic illustration of an exemplary embodiment for coupling to waveguides which meet the associated chip edge at an angle, wherein the beam-shaping elements each consist of only one refractive surface.

The beam-shaping element can, as illustrated in FIG. 30, also be located in a further preferred embodiment on the second chip or fiber array 153, in which the waveguides meet the edge perpendicularly. It is furthermore possible, as is shown in FIG. 31, for two beam-shaping elements per coupling location to be used, wherein one beam-shaping element 41 is located on the chip or fiber array 153 having waveguides which meet the edge perpendicularly, while the other beam-shaping element 40 is located on the optical chip 154 having waveguides which meet the edge at an angle. The use of two beam-shaping elements makes it possible in particular to lower the accuracy requirements with respect to a subsequent positioning and fixing step due to a corresponding beam expansion. It is possible here for the beam-shaping element 41 to preferably comprise a refractive surface 220, while the beam-shaping element 40 can have a combination of a refractive surface 210 and a reflective surface 45, 46, 47. FIG. 32 shows a further preferred embodiment, in which two optical chips 154, 155 having waveguides that meet the edge at an angle are connected by beam-shaping components 40, 41, which are both designed as combinations of mirrors and refractive surfaces. It is possible hereby to avoid coupling of back-reflections 39 into guided waveguide modes at both components 10, 11 and additionally to lower the requirements with respect to the positioning accuracy. The waveguides 86 of the components 10, 11 can here be adjusted such that a parallel alignment of the propagation directions 74, 75 occurs. FIG. 33 shows a further preferred arrangement, in which beam-shaping components 40, which each comprise only one refractive surface 210, are used to adapt the propagation directions 74, 75.

While exemplary embodiments have been disclosed hereinabove, the present invention is not limited to the disclosed embodiments. Instead, this application is intended to cover any variations, uses, or adaptations of this disclosure using its general principles. Further, this application is intended to cover such departures from the present disclosure as come within known or customary practice in the art to which this invention pertains and which fall within the limits of the appended claims.

LIST OF REFERENCE SIGNS

10 First optical component
11 Second optical component
12 Surface modification
15 Supplemented first optical component
16 Supplemented second optical component
20 Optical fiber
21 Core of the optical fiber
22 Cladding of the optical fiber
25 First single-mode fiber
26 Second single-mode fiber
27 First lens
28 Second lens
29 Optical axis of the optical system
30 First beam profile
31 Second beam profile
32 Mode field with expanded profile
33 Non-rotation-symmetric beam profile having a lower extent in the x-direction and a greater extent in the y-direction
34 More greatly extended proportion of the beam profile 33 with low divergence
35 Less greatly extended proportion of the beam profile 33 with greater divergence
36 Mode field in the narrowing part (taper) of an integrated waveguide
37 Beam progression without angle deviation 61 (solid curve)
38 Beam progression with angle deviation 61 (dashed curve)
39 Back-reflection
40 (First) beam-shaping element
41 Second beam-shaping element
42 Expanding portion of the beam path or expanding part of the beam-shaping element
43 Collimating portion of the beam path or collimating part of the beam-shaping element
44 Spacer produced using two-photon lithography
45 (Bi)convex mirror
46 (Bi)concave mirror
47 Plane mirror
48 Freeform optical waveguide
49 Freeform surface without optical functionality
50 Base plate
51 Spacer
52 Optically transparent material; embedding medium having a lower refractive index than the beam-shaping elements
53 Optically transparent material; embedding medium having a higher refractive index than the beam-shaping elements
54 Additional optical element
55 Cavity
56 (Edge-emitting) semiconductor laser
57 Resist material
60 Angle
61 Angle deviation
70 Focal point (focus)
73 Focal length
74 Propagation direction of light exiting the first optical component 10
75 Propagation direction of light exiting the second optical component 11 Normal direction with respect to the first optical component 10 and with respect to the second optical component 11
80 SOI taper
81 InP taper
82 Single-mode fiber (SMF)
83 Beam expander
84 Beam expander in embedding medium
85 Silicon waveguide
86 Waveguide which does not meet a facet perpendicularly
101 Base plate
102 Conductor tracks for radio-frequency electronics
103 Bonding wires
104 Edge-emitting laser
105 Beam expander
106 Modulator
107 Arrayed-waveguide grating (AWG)
114 Mode field expander, integrated in SiN technology
119 Single-mode fiber (SMF)
120 Cladding of a single-mode fiber 119
130 to 137 Coupling locations
140 to 147 Beam-shaping elements
150 Planarization layer
151 Groove of an adjustment structure
152 Pin of an adjustment structure
153 Fiber array
154 Optical chip
155 Further optical chip
156 Electrical chip or electrical printed circuit board
157 Optical printed circuit board
158 Electrical contact location
202 Target size of an optical component
203 Positive deviation from target size of an optical component
204 Negative deviation from target size of an optical component
205 Lengthening of a beam-shaping component in the case of negative deviation of an optical component from its target size 206 Shortening of a beam-shaping component in the case of positive deviation of an optical component from its target size
210 Refractive surface of a beam-shaping element
220 Further refractive surface of a beam-shaping element

What is claimed is:

1. An optical system, comprising:
a first optical component having a first beam profile;
a second optical component having a second beam profile;
a first beam-shaping element fixedly connected to the first optical component and a second beam-shaping element fixedly connected to the second optical component, wherein the first beam-shaping element is configured to change the first beam profile and wherein the second beam-shaping element is configured to change the second beam profile to thereby form an optical coupling between the first optical component and the second optical component, wherein the first beam-shaping element and the second beam-shaping element are each formed in situ at a respective target position by three-dimensional direct-writing lithography; and
wherein the first optical component and the second optical component are arranged on a common base plate.

2. The optical system of claim 1, wherein the at least one of the first and second beam-shaping elements has at least one part selected from a beam-expanding part, a collimating part, or a beam-narrowing part, wherein the beam-expanding part is configured to increase a local beam divergence, wherein the collimating part is configured to keep a beam diameter constant, and wherein the beam-narrowing part is configured to reduce a local beam divergence.

3. The optical system of claim 2, wherein the at least one beam-shaping element comprises a beam-expanding part, a waveguide, and a collimating part reducing a divergence of an exiting beam.

4. The optical system of claim 2, wherein the beam-expanding part has a structure which is selected from a reflective structure, a refractive structure, a light-guiding structure, or a diffractive structure.

5. The optical system of claim 1, wherein at least one further optical component is located between the first and second beam-shaping elements.

6. The optical system of claim 1, wherein at least one of the optical components has a waveguide, which does not meet a facet perpendicularly, and wherein at least one of the first and second beam-shaping elements merges beam propagation directions into one another.

7. The optical system of claim 1, wherein interspaces between the first and second beam-shaping elements are filled at least partially with an optically transparent material, wherein the optically transparent material is configured to reduce at least one of reflection losses between the first and second beam-shaping elements or a chromatic aberration of a light beam passing through the first and second beam-shaping elements.

8. The optical system of claim 1, wherein a beam path optically couples the first optical component and the second optical component and the beam path has at least one portion selected from a beam-expanding portion, a collimated portion, or a beam-narrowing portion, wherein the beam-expanding portion is configured to increase a local beam divergence, wherein the collimating portion is configured to keep a beam diameter constant, and wherein the beam-narrowing portion is configured to reduce a local beam divergence.

9. The optical system of claim 8, wherein the beam path comprises a beam-expanding part, a waveguide, and a collimating part being configured for reducing a divergence of an exiting beam.

10. The optical system of claim 1, wherein an optical coupling of the first optical component and the second optical component utilizes a beam having a diameter of 5 μm to 100 μm outside the at least one beam-shaping element.

11. The optical system of claim 1, wherein the first optical component is an optical chip and the first beam-shaping element is applied on the optical chip and is configured such that a deflection of light propagating in a plane of the optical chip into a direction that is oriented at an angle with respect to the surface of the optical chip is effected or light from a direction that is oriented at an angle with respect to the surface of the optical chip is deflected in a propagation direction that is located in the surface of the optical chip, wherein the angle is at least 50° relative to the surface of the optical chip.

12. The optical system of claim 11, wherein the propagating light traverses a further optical chip or an optically transparent window located in the optical chip or in the further optical chip.

13. The optical system of claim 11, wherein the second optical component comprises a second optical chip with the second beam-shaping element fixed thereto, wherein the light propagating from the first optical component is coupled into the second beam-shaping element, and wherein the first and second beam-shaping elements are configured to deflect light from a direction which is oriented at an angle with respect to the surface of the respective optical chip into a propagation direction which is located in the plane of the respective optical chip.

14. The optical system of claim 1, wherein an optical coupling of the first optical component and the second optical component utilizes a beam defining a beam propagation direction and wherein at least one of the first and second optical components has a facet and a waveguide wherein the waveguide intersects the facet non-perpendicularly and wherein at least one surface of the at least one of the first and second beam-shaping elements intersects the beam propagation direction non-perpendicularly.

15. The optical system of claim 14, wherein all waveguides of all optical components intersect a facet non-perpendicularly and wherein all beam-shaping elements have a surface that intersects a beam-propagation direction non-perpendicularly.

16. The optical system of claim 1, wherein at least one of the first and second beam-shaping elements is supported by a support structure.

17. The optical system of claim 1, wherein at least one of the first and second beam-shaping elements is configured to compensate pitch inaccuracies of a fiber array.

* * * * *